United States Patent
Tsuji et al.

(10) Patent No.: US 8,098,523 B2
(45) Date of Patent: *Jan. 17, 2012

(54) SEMICONDUCTOR MEMORY DEVICE WITH MEMORY CELL HAVING CHARGE ACCUMULATION LAYER AND CONTROL GATE AND MEMORY SYSTEM

(75) Inventors: Hidetaka Tsuji, Yokohama (JP); Tomoji Takada, Kawasaki (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

This patent is subject to a terminal disclaimer.

(21) Appl. No.: 12/831,689

(22) Filed: Jul. 7, 2010

(65) Prior Publication Data

US 2010/0271876 A1  Oct. 28, 2010

Related U.S. Application Data

(63) Continuation of application No. 12/166,909, filed on Jul. 2, 2008, now Pat. No. 7,773,417.

(30) Foreign Application Priority Data

Jul. 5, 2007 (JP) .................................. 2007-177600

(51) Int. Cl.
*G11C 16/04* (2006.01)
(52) U.S. Cl. ......... 365/185.03; 365/185.11; 365/185.33; 365/230.03
(58) Field of Classification Search .............. 365/185.03, 365/185.11, 185.33, 230.03
See application file for complete search history.

(56) References Cited

U.S. PATENT DOCUMENTS

| | | | | |
|---|---|---|---|---|
| 5,847,999 A * | 12/1998 | Kwon | ................ | 365/185.33 |
| 7,310,267 B2 * | 12/2007 | Youn | ................ | 365/185.05 |
| 7,539,053 B2 * | 5/2009 | Kanda | ................ | 365/185.03 |
| 7,623,384 B2 * | 11/2009 | Iwata | ................ | 365/185.17 |
| 7,773,417 B2 * | 8/2010 | Tsuji et al. | ................ | 365/185.03 |
| 2009/0292863 A1 | 11/2009 | Shiga et al. | | |

FOREIGN PATENT DOCUMENTS

| | | |
|---|---|---|
| JP | 11-176178 | 7/1999 |
| JP | 2001-250386 | 9/2001 |
| JP | 2005-235260 | 9/2005 |
| JP | 2007-18499 | 1/2007 |
| KR | 1999-13057 | 2/1999 |
| KR | 1999-79926 | 11/1999 |
| KR | 0666174 | 1/2007 |

OTHER PUBLICATIONS

Official Action mailed Nov. 22, 2011, in corresponding application filed in Japan with English translation.

* cited by examiner

*Primary Examiner* — Pho M Luu
(74) *Attorney, Agent, or Firm* — Oblon, Spivak, McClelland, Maier & Neustadt, L.L.P.

(57) ABSTRACT

A semiconductor memory device includes first memory cell transistors, a memory block, and word lines. Each of the first memory cell transistors has a stacked gate including a charge accumulation layer and a control gate and is capable of holding M bits ($M \neq 2^i$, where i is a natural number and M is a natural number greater than or equal to 3) of data. The memory block includes the first memory cell transistors and is erase unit of the data. The data held in the first memory cell transistors included in the memory block is erased simultaneously. The size of data the memory block is capable of holding is L bits ($L=2^k$, where k is a natural number). The word lines connect in common the control gates of the first memory cell transistors.

13 Claims, 20 Drawing Sheets

| Pin No. | Signal |
|---|---|
| Pin 1 | Card detection/data 3 (DAT3) |
| Pin 2 | Command (CMD) |
| Pin 3 | Vss |
| Pin 4 | Vdd |
| Pin 5 | Clock (CLK) |
| Pin 6 | Vss |
| Pin 7 | Data 0 (DAT0) |
| Pin 8 | Data 1 (DAT1) |
| Pin 9 | Data 2 (DAT2) |

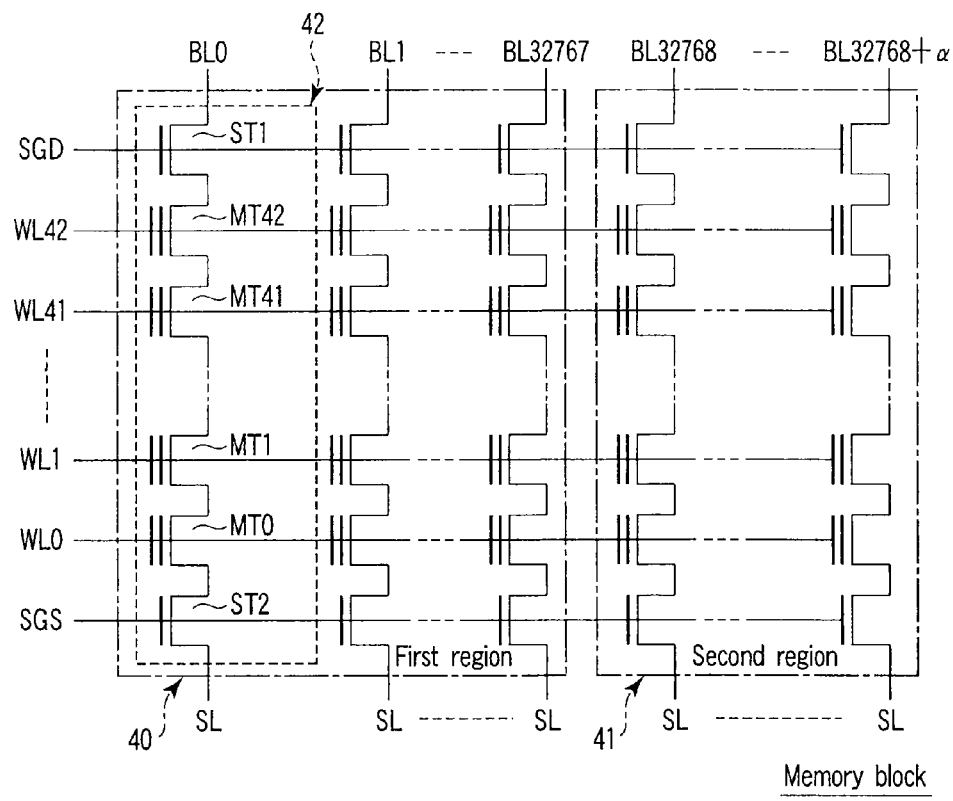
F I G. 5
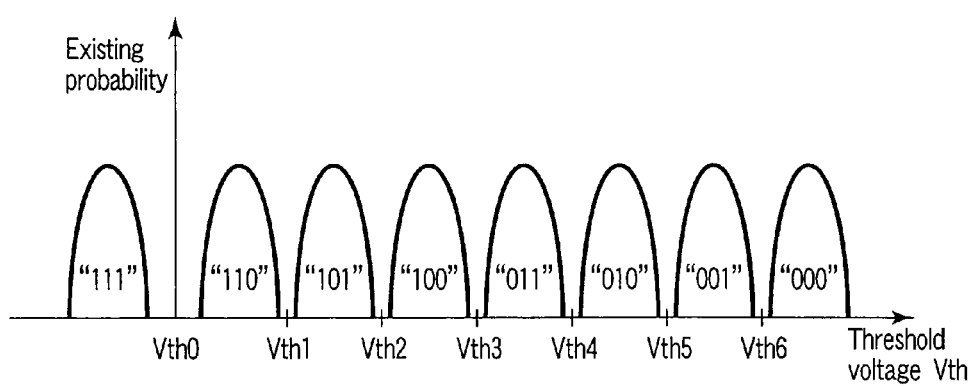
F I G. 6

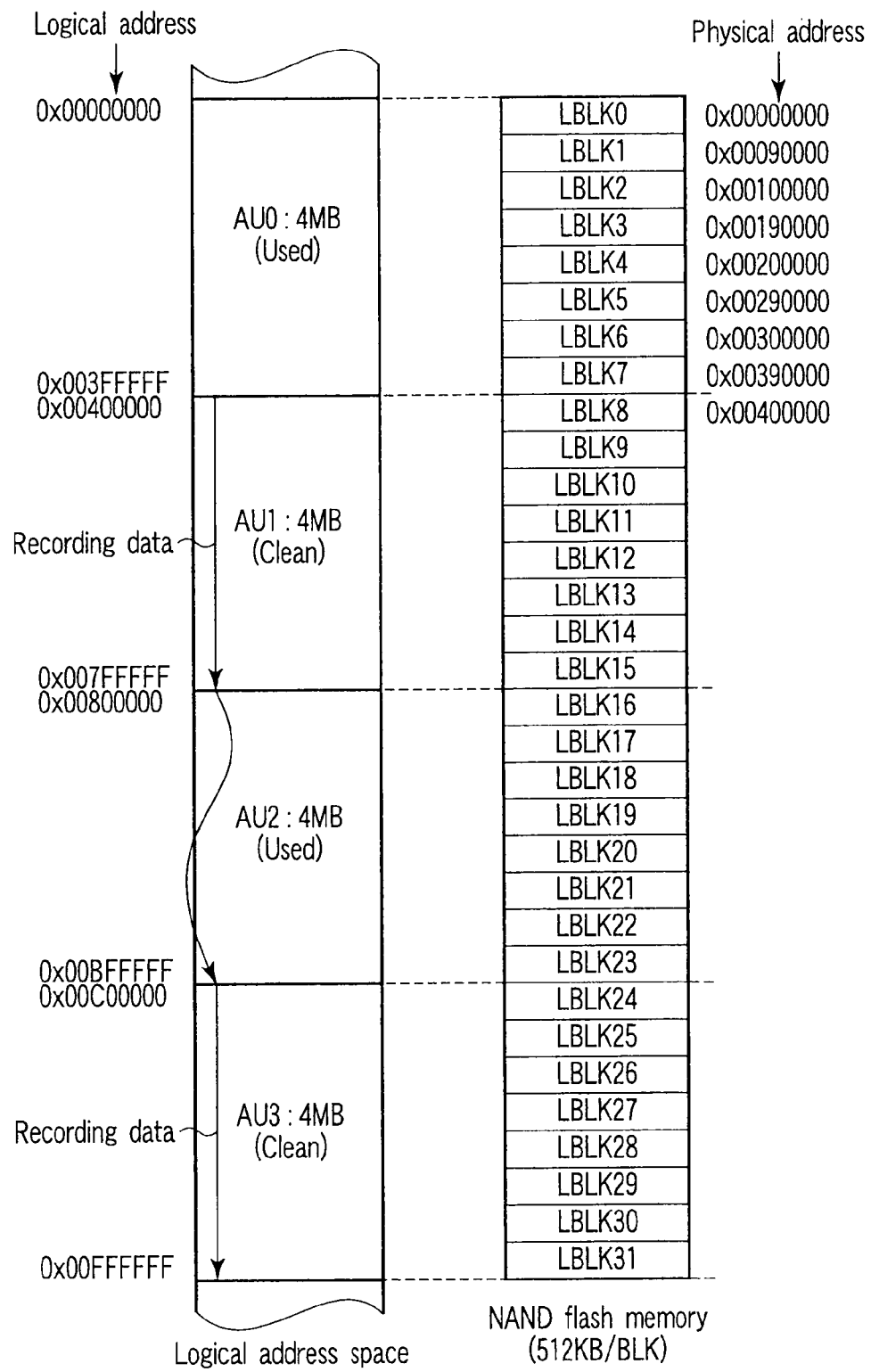
F I G. 11

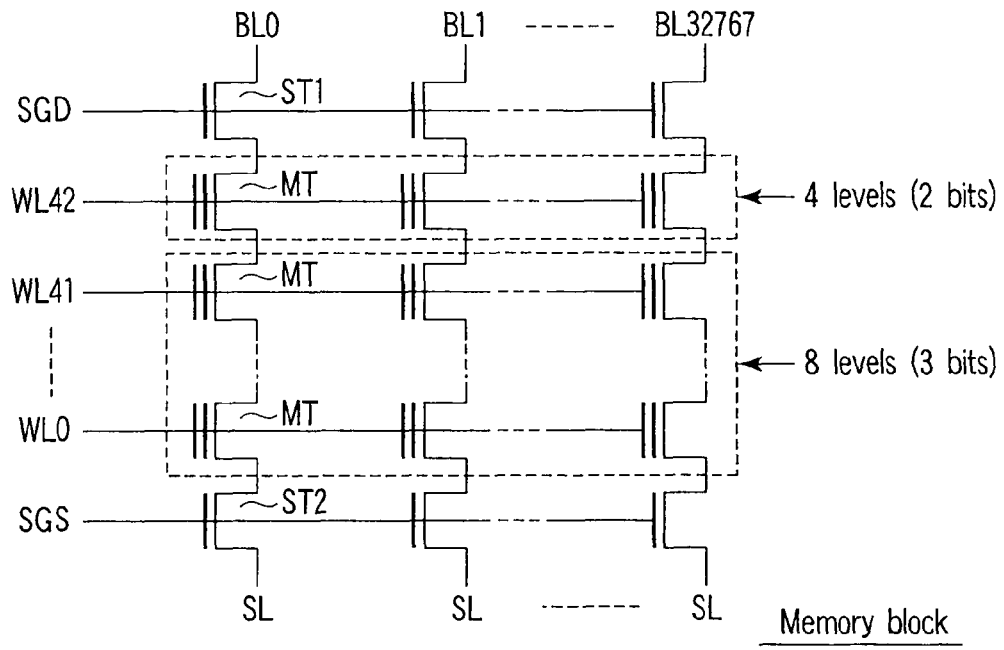
F I G. 12
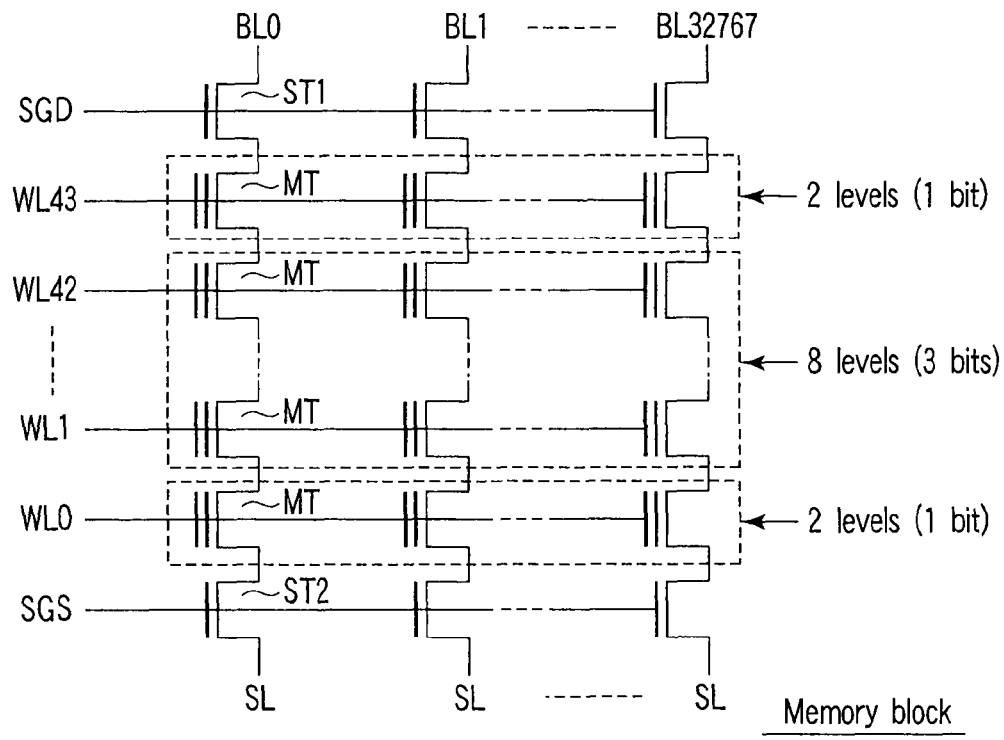
F I G. 13

SEMICONDUCTOR MEMORY DEVICE WITH MEMORY CELL HAVING CHARGE ACCUMULATION LAYER AND CONTROL GATE AND MEMORY SYSTEM

CROSS-REFERENCE TO RELATED APPLICATIONS

This is a continuation of application Ser. No. 12/166,909, filed Jul. 2, 2008, now U.S. Pat. No. 7,773,417, issued Aug. 10, 2010, which is based upon and claims the benefit of priority from prior Japanese Patent Application No. 2007-177600, filed Jul. 5, 2007, the entire contents of which are incorporated herein by reference.

BACKGROUND OF THE INVENTION

1. Field of the Invention

This invention relates to a semiconductor memory device and a memory system, and more particularly to a semiconductor memory device with memory cells each of which have a charge accumulation layer and a control gate.

2. Description of the Related Art

A multilevel NAND flash memory has been known. A multilevel NAND flash memory is a NAND flash memory which enables each memory cell to hold 2 or more bits of data. For example, in a 4-level NAND flash memory, one memory cell holds 2 bits of data. In an 8-level NAND flash memory, one memory holds 3 bits of data. Such configurations have been disclosed in, for example, U.S. Pat. No. 5,847,999.

If a memory block has 64 word lines and 32K bit lines in a NAND flash memory, the capacity of a 2-level NAND flash memory is 256 Kbytes, the capacity of a 4-level NAND flash memory is 512 Kbytes, and the capacity of an 8-level NAND flash memory is 768 Kbytes. Here, a memory block is a set of memory cells. The data in the memory cells in the same memory block are erased simultaneously.

Furthermore, the NAND flash memory uses a method of, for example, when recording video, securing a logical space whose size is somewhat large and which has consecutive logical addresses and recording video in the logical space. The logical space is known as an allocation unit (AU). The size of the AU is generally set at a power-of-two value.

For example, in a multilevel NAND flash memory, such as an 8-level NAND flash memory, its memory capacity may not be expressed by a power-of-two value. Accordingly, in the 8-level NAND flash memory, the size of the AU does not coincide with an integral multiple of the size of the memory block. As a result, the multilevel NAND flash memory needs the operation of copying data and therefore may have to stop recording video for a while, which is a problem.

BRIEF SUMMARY OF THE INVENTION

A semiconductor memory device according to an aspect of the present invention includes:

a plurality of first memory cell transistors each of which has a stacked gate including a charge accumulation layer and a control gate and is capable of holding M bits ($M \neq 2^i$, where i is a natural number and M is a natural number greater than or equal to 3) of data;

a memory block which includes the first memory cell transistors and which is erase unit of the data, the data held in the first memory cell transistors included in the memory block being erased simultaneously, and the size of data the memory block is capable of holding being L bits ($L=2^k$, where k is a natural number); and a plurality of word lines which connect in common the control gates of the first memory cell transistors.

A memory system according to an aspect of the present invention includes:

a semiconductor memory device which is capable of holding data and which includes a plurality of memory cell transistors each of which has a stacked gate including a charge accumulation layer and a control gate and is capable of holding M bits (M is a natural number greater than or equal to 2) of data, first and second word lines which connects the control gates of the memory cell transistors, and a plurality of memory blocks each of which includes the memory cell transistors and is erase unit of the data, the data held in the memory cell transistors included in the same memory block being erased simultaneously, and each of which includes a first memory region and a second memory region, the first memory region being a memory space which is formed by the M bits in each of the memory cell transistors connected to the first word lines or the M bits in each of the memory cell transistors connected to the first word lines and j bits (j is a natural number satisfying j<M) of the M bits in each of the memory cell transistors connected to the second word lines and which is capable of holding L bits ($=2^k$, where k is a natural number) in a data size, and the second memory region being a memory space formed by the M bits or (M−j) bits in each of the memory cell transistors connected to the second word lines; and a controller which is capable of receiving first data from a host apparatus and writing the first data to the semiconductor memory device and which includes an interface which receives the first data from the host apparatus, and a processor which writes the first data to the first memory region of the semiconductor memory device and generates second data which is information on the memory blocks, and writes the second data to the second memory region of the semiconductor memory device.

BRIEF DESCRIPTION OF THE SEVERAL VIEWS OF THE DRAWING

FIG. 5 is a circuit diagram of the flash memory according to the first embodiment;

FIG. 6 is a graph showing a threshold value distribution of a memory cell transistor included in the flash memory of the first embodiment;

FIG. 11 is a conceptual diagram of the memory space and memory blocks in the flash memory according to the first embodiment;

FIG. 12 is a circuit diagram of the flash memory according to the first embodiment;

FIGS. 13 and 14 circuit diagrams of flash memories according to a first and a second modification of the first embodiment, respectively;

DETAILED DESCRIPTION OF THE INVENTION

First Embodiment

Figures 1, 2:
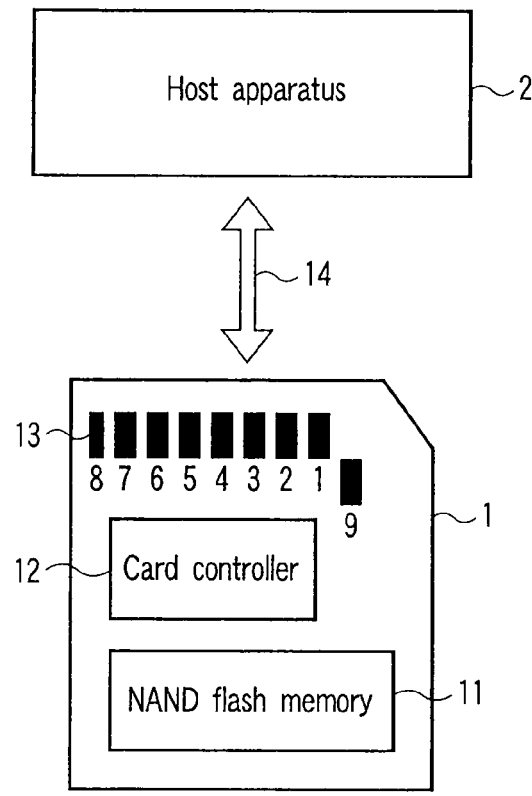
FIG. 1 is a block diagram of a memory system according to a first embodiment of the invention.
FIG. 2 is a table showing the allocation of signals to signal pins in a memory card according to the first embodiment.

A semiconductor memory device and a memory system according to a first embodiment of the present invention will be explained using FIG. 1. FIG. 1 is a block diagram of a memory system according to the first embodiment.

As shown in FIG. 1, the memory system includes a memory card 1 and a host apparatus 2. The host apparatus 2 includes hardware and software which are for accessing the memory card 1 to which the apparatus 2 is connected via a bus interface 14. When being connected to the host apparatus 2, the memory card 1 is supplied with power and then operates, thereby carrying out a process according to the access from the host apparatus 2.

The memory card 1 exchanges information with the host apparatus 2 via the bus interface 14. The memory card 1 includes an 8-level NAND flash memory chip (sometimes simply referred to as a NAND flash memory or a flash memory) 11, a card controller 12 for controlling the flash memory chip 11, and a plurality of signal pins (first to ninth pins) 13.

The plurality of signal pins 13 are connected electrically to the card controller 12. The allocation of signals to the first to ninth ones of the plurality of signal pins 13 is, for example, as shown in FIG. 2. FIG. 2 is a table showing the first to ninth pins and the signals allocated to the pins.

Data 0 to data 3 are allocated to a seventh pin, an eighth pin, a ninth pin, and a first pin, respectively. The first pin is also allocated to a card detection signal. A second pin is allocated to a command. A third and a sixth pins are allocated to the ground potential Vss. A fourth pin is allocated to a power supply potential Vdd. A fifth pin is allocated to a clock signal.

The memory card 1 is so formed that it can be inserted into and removed from a slot made in the host apparatus 2. A host controller (not shown) provided in the host apparatus 2 exchanges various signals and data with the card controller 12 in the memory card 1 via the first to ninth pins. For example, when data is written to the memory card 1, the host controller sends a write command via the second pin to the card controller 12 in the form of a serial signal. At this time, in response to the clock signal supplied to the fifth pin, the card controller 12 takes in the write command given to the second pin.

As described above, the write command is input serially to the card controller 12 via only the second pin. As shown in FIG. 2, the second pin allocated to the input of a command is arranged between the first pin for data 3 and the third pin for the ground potential Vss. The plurality of signal pins 13 and the bus interface 14 for the pins 13 are used for the host controller and memory card 1 in the host apparatus 2 to communicate with each other.

In contrast, the communication between the flash memory 11 and card controller 12 is performed by a NAND flash memory interface. Accordingly, although not shown, the flash memory 11 and card controller 12 are connected to each other with, for example, 8-bit input/output (I/O) lines.

For example, when writing data to the flash memory 11, the card controller 12 inputs a data input command 80H, a column address, a page address, data, and a program command 10H sequentially to the flash memory 11 via the I/O lines. Here, "H" in the command 80H represents a hexadecimal number. Actually, an 8-bit signal of "10000000" is supplied to 8-bit I/O lines in parallel. That is, in the NAND flash memory interface, a multi-bit command is supplied in parallel.

Furthermore, in the NAND flash memory interface, the command and data are transmitted to the flash memory 11 using the same I/O lines. As described above, the interface for the communication between the host controller in the host apparatus 2 and memory card 1 differs from the interface for the communication between the flash memory 11 and card controller 12.

Figure 3:
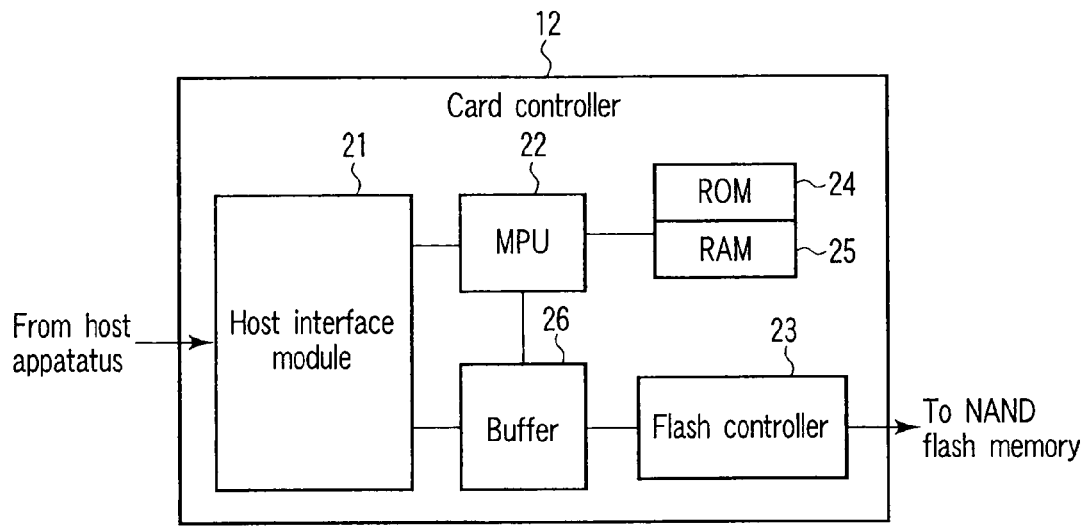
FIG. 3 is a block diagram of a card controller included in the memory card of the first embodiment.

Next, the internal configuration of the card controller included in the memory card 1 of FIG. 1 will be explained using FIG. 3. FIG. 3 is a block diagram of the card controller 12.

The card controller 12 manages the physical state in the flash memory 11 (e.g., what block address includes what number logical sector address data or which block is in the erased state). The card controller 12 includes a host interface module 21, a microprocessor unit (MPU) 22, a flash controller 23, a read-only memory (ROM) 24, a random access memory (RAM) 25, and a buffer 26.

The host interface module 21 executes an interfacing process between the card controller 12 and the host apparatus 2.

Using the firmware stored in the ROM 24 and various tables (and a part of the firmware) stored in the RAM 25, the MPU 22 carries out a process requested by the host apparatus.

The ROM 24 stores a control program and the like controlled by the MPU 22. The RAM 25, which is used as a work area for the MPU 22, stores a control program and various tables. The flash controller 23 executes an interfacing process between the card controller 12 and the flash memory 11.

The buffer 26, when writing the data sent from the host apparatus 2 to the flash memory 11, temporarily stores a specific amount of data (e.g., one page of data) or, when sending the data read from the flash memory 11 to the host apparatus 2, temporarily stores a specific amount of data.

Figure 4:
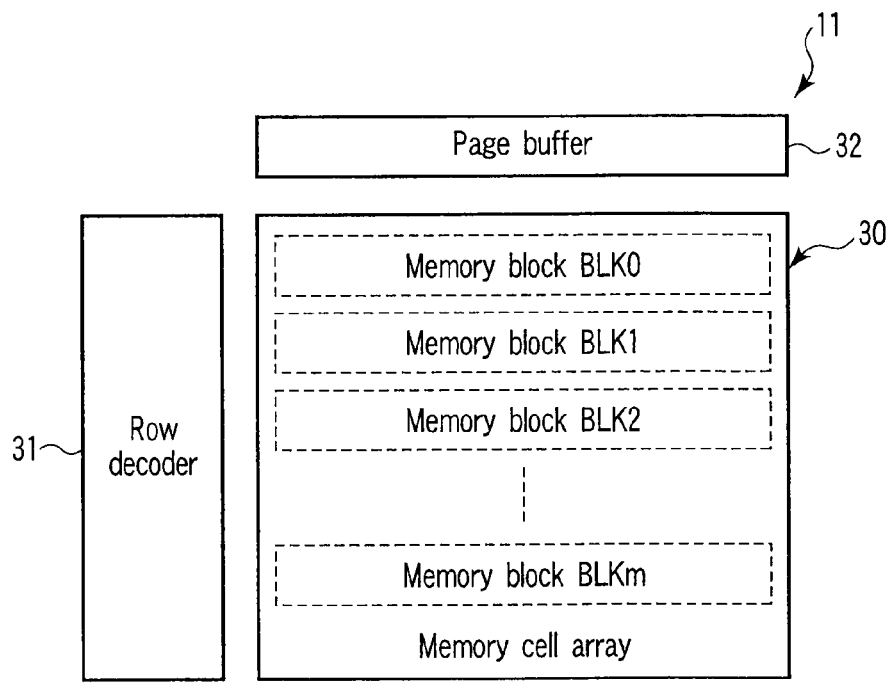
FIG. 4 is a block diagram of a flash memory according to the first embodiment.

Next, the internal configuration of the NAND flash memory 11 will be explained briefly. FIG. 4 is a block diagram of the NAND flash memory 11. As shown in FIG. 4, the NAND flash memory 11 includes a memory cell array 30, a row decoder 31, and a page buffer 32.

The memory cell array 30 includes a plurality of memory blocks BLK0 to BLKm (m is a natural number greater than or equal to 2). Hereinafter, when the memory blocks BLK0 to BLKm are not distinguished from one another, they are simply called the memory blocks BLK. Each of the memory blocks BLK includes the memory cells which are capable of holding data. Data is erased in memory blocks BLK. That is, the data in the same memory block BLK is erased simultaneously.

According to a row address signal supplied from the card controller 12, the row decoder 31 selects the row direction of any one of the memory blocks BLK in the memory cell array 30.

The page buffer 32, which inputs and receives data to and from the memory cell array 11, stores data temporarily. The data exchange between the page buffer 32 and memory cell array 11 is performed in units of a plurality of items of data. That is, data is written to a plurality of memory cells simultaneously. Hereinafter, this data unit is referred to as a page.

Next, the configuration of a memory block BLK included in the memory cell array 11 will be explained using FIG. 5. FIG. 5 is a circuit diagram of the memory block BLK.

As shown in FIG. 5, a memory block BLK roughly includes a first region 40 and a second region 41. Both the first region 40 and second region 41 are configured to be capable of holding data. The second region is used as a redundant part. For example, the second region is used to hold ECC data.

First, the first region 40 will be explained. The first region 40 includes, for example, 32K (K is 1024) NAND cells 42. Each of the NAND cells 42 includes, for example, 43 memory cell transistors MT0 to MT42 and select transistors ST1, ST2. Hereinafter, when the memory cell transistors MT0 to MT42 are not distinguished from one another, they are simply called the memory cell transistors MT. The current paths of the memory cell transistors MT0 to MT42 are connected in series between the drain of the select transistor ST2 and the source of the select transistor ST1. Each of the memory cell transistors MT has a stacked gate which includes a charge accumulation layer (e.g., a floating gate) formed on a semiconductor substrate with a gate insulating film interposed therebetween and a control gate formed on the charge accumulation layer with an inter-gate insulating film interposed therebetween.

The source of the select transistor ST2 is connected to a source line SL in common. The drain of the select transistor ST1 is connected to any one of 32K bit lines BL0 to BL32767. The bit lines BL0 to BL32767 connect NAND cells 42 in common between a plurality of memory blocks BLK. Hereinafter, when the bit lines BL0 to BL32767 are not distinguished from one another, they are simply referred to as the bit lines BL. The control gates of the memory cell transistors MT0 to MT42 in the same memory block BLK are connected to word line WL0 to WL42, respectively. The gates of the select transistors ST1, ST2 are connected to select gate lines SGD, SGS, respectively.

With the above configuration, the 32K memory cell transistors MT connected to any one of the word lines WL are written simultaneously.

Next, the second region 41 will be explained. Like the first region 40, the second region includes a plurality of (($\alpha$+1), $\alpha$ being a natural number) NAND cells 42. In each of the NAND cells 42, the drain of the select transistor ST1 is connected to any one of the bit lines BL32768 to BL32768+$\alpha$. The source of the select transistor ST2 is connected to the source line SL. The control gates of the memory cell transistors MT0 to MT42 are connected to word line WL0 to WL42, respectively. The gates of the select transistors ST1, ST2 are connected to select gate lines SGD, SGS, respectively.

With the above configuration, ($\alpha$+1) memory cell transistors MT connected to any one of the word lines WL are written simultaneously.

Hereinafter, for ease of explanation, a description of the second region 41 serving as the redundant part will be omitted. An explanation will be given on the assumption that a memory block BLK is written in units of 32K memory cell transistors MT in the first region 40.

Each of the memory cell transistors MT included in the NAND cell 42 is configured to be capable of holding 8-level (3-bit) data, "111," "110," "101," "100," "011," "010," "001," and "000." FIG. 6 is a graph showing the threshold voltage of a memory cell transistor MT, particularly showing a threshold voltage distribution in holding each item of data of the 8 levels.

As shown in FIG. 6, the threshold voltage of the memory cell transistor MT rises in this order: "111," "110," "101," "100," "011," "010," "001," and "000." Specifically, the threshold voltage Vth of the memory cell transistor MT which holds data "111" is set to satisfy Vth<Vth0. The threshold voltage Vth of the memory cell transistor MT which holds data "110" is set to satisfy Vth0<Vth<Vth1. The threshold voltage Vth of the memory cell transistor MT which holds data "101" is set to satisfy Vth1<Vth<Vth2. The threshold voltage Vth of the memory cell transistor MT which holds data "100" is set to satisfy Vth2<Vth<Vth3. The threshold voltage Vth of the memory cell transistor MT which holds data "011" is set to satisfy Vth3<Vth<Vth4. The threshold voltage Vth of the memory cell transistor MT which holds data "010" is set to satisfy Vth4<Vth<Vth5. The threshold voltage Vth of the memory cell transistor MT which holds data "001" is set to satisfy Vth5<Vth<Vth6. The threshold voltage Vth of the memory cell transistor MT which holds data "000" is set to satisfy Vth6<Vth.

While in FIG. 6, the threshold voltage rises in the order of "111," "110," "101," "100," "011," "010," "001," and "000,"

this is illustrative and not restrictive and the correspondence between the individual items of data and their threshold voltages may be set arbitrarily.

Figure 7:
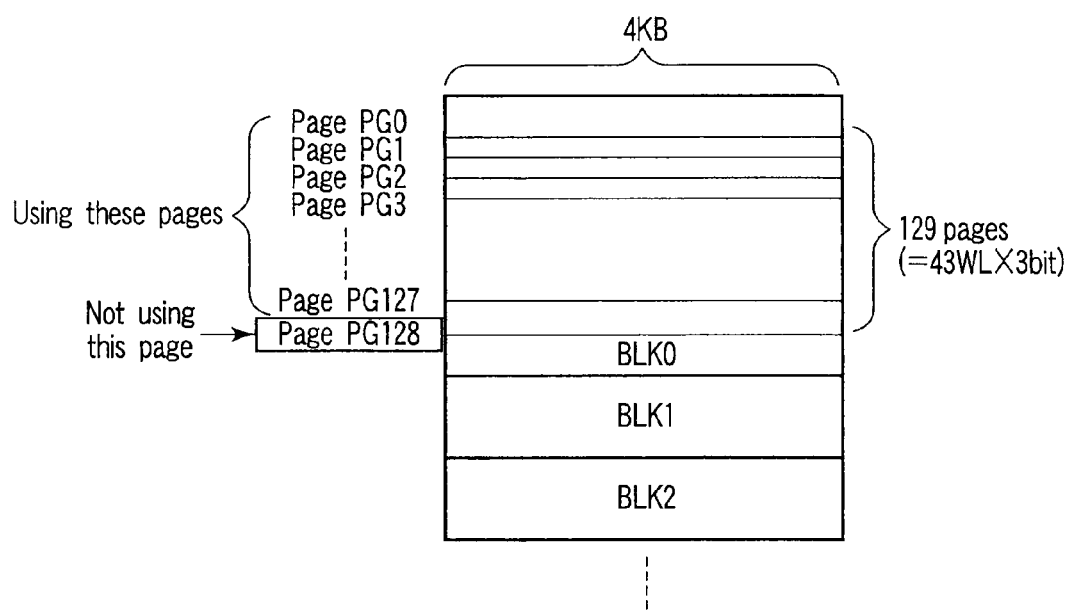
FIG. 7 is a block diagram of a memory block included in the flash memory of the first embodiment.

FIG. 7 is a block diagram of the memory blocks BLK, showing the memory blocks BLK in pages.

As described above, each memory cell transistor MT is capable of holding 3-bit data. The data is written in bits. That is, in one write operation, any one of the three bits is written simultaneously to the 32K memory cell transistors MT connected to a certain word line WL. Accordingly, in the 8-level (3-bit) NAND flash memory, three pages are allocated to each word line WL.

In the first embodiment, since each block BLK includes 43 word lines WL0 to WL42, one memory block BLK has (43 WL×3 bits)=129 pages. Hereinafter, the 129 pages are called page PG0 to page PG128, respectively. For example, the individual items of 3-bit data held in the memory cell transistor MT connected to word line WLk (k is in the range of 0 to 42) correspond to pages PG (k×3) to PG (k×3+2), respectively. That is, the 3 bits held in the memory cell transistor MT connected to word line WL0 correspond to pages PG0 to PG2, respectively. The 3 bits held in the memory cell transistor MT connected to word line WL1 correspond to pages PG3 to PG5, respectively. The 3 bits held in the memory cell transistor MT connected to word line WL42 correspond to pages PG126 to PG128, respectively.

In the first embodiment, of the 129 pages, only the 128 pages are actually used for data storage and the residual one page is not used as data storage. In the example of FIG. 7, pages PG0 to PG127 are used for data storage and page PG128 is not used. That is, the card controller 12 does not allocate a logical address to page PG128. As a result, page PG128 is not selected by the row decoder 31. Accordingly, since the data size of one page is 32 Kbits=4 Kbytes, the data size of each memory block BLK is (4K×128 pages)=512 Kbytes.

As described above, the NAND flash memory according to the first embodiment produces the effect described in Item (1), below:

(1) Highly reliable data recording can be performed in the NAND flash memory.

With the configuration of the first embodiment, the data size which can be held in one memory block BLK is set to 512 Kbytes, that is, a power-of-two size in an 8-level NAND flash memory. Accordingly, the reliability of data storage can be improved. This effect will be explained in detail below.

In the 8-level NAND flash memory, one memory cell transistor MT holds 3-bit data as described above. The number of word lines included in one memory block BLK is generally set to a value which can be expressed by a power-of-two value. If the page size is 32 Kbits and the number of word lines is 64, the data size of the memory block BLK is 768 Kbytes.

In a control system using a NAND flash memory, the correspondence between logical addresses and physical addresses is generally realized in units of one or more memory blocks BLK. The unit is known as a logical block. A logical address is an address used in accessing a NAND flash memory from the outside. A physical address is a unique address allocated to each memory block BLK.

Figure 8:
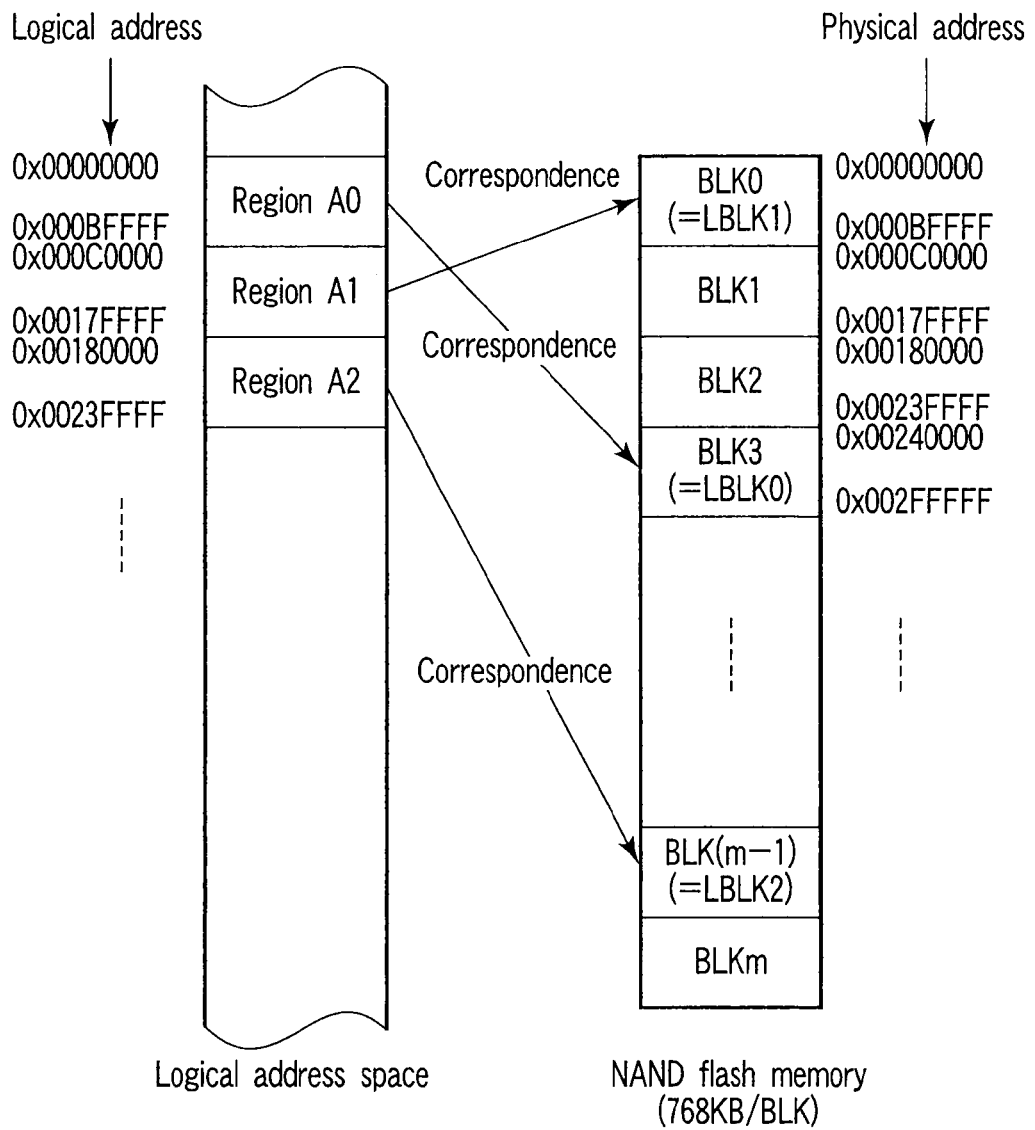
FIG. 8 is a conceptual diagram of the memory space and memory blocks of the flash memory according to the first embodiment.

The correspondence between logical addresses and physical addresses in an 8-level NAND flash memory where the data size of a memory block BLK is 768 Kbytes is as shown in FIG. 8. FIG. 8 is a conceptual diagram showing the correspondence between the logical address space and the individual memory blocks BLK in a case where one memory block BLK is treated as the smallest unit.

When one memory block BLK is treated as the smallest unit, the logical block size is 768 Kbytes. In the example of FIG. 8, region A0 (logical block LBLK0) whose logical addresses range from "0x00000000" to "0x000BFFFF" in the logical access space corresponds to memory block BLK3. Region A1 (logical block LBLK1) whose logical addresses range from "0x000C0000" to "0x0017FFFF" corresponds to memory block BLK0. Region A2 (logical block LBLK2) whose logical addresses range from "0x00180000" to "0x0023FFFF" corresponds to memory block BLK(m−1). Here, "0x" attached to the head of the address indicates the address is in hexadecimal form.

In a storage system using a NAND flash memory, a file allocation table (FAT) file system is generally used. A file system is a method of managing the files (data) recorded in the memory. The FAT file system determines a method of creating directory information on files and folders, in the NAND flash memory, a method of moving files, folders, and the like, a method of deleting files, folders, and the like, a data recording method, the locations of management regions, a method of using management regions, and others. In a storage system using a FAT file system, the unnecessary file data is actually not erased and the FAT is cleared. When a new file is written, it is overwritten in the NAND flash memory. Moreover, in a NAND control system, whether the written data is valid or invalid is not generally determined (referring to the FAT). The FAT file system is widely used in a digital video camera, a mobile phone, and the like which record video data in a NAND flash memory.

However, in the NAND flash memory, data can be erased only in memory blocks BLK. Accordingly, when video data is written in nonconsecutive addresses, a copying process is needed for the data held between one part of the video data and another part of the video data. The copying process causes the host apparatus to wait for the transfer of data (video data). In this case, if the buffer of the host apparatus cannot absorb the waiting time, that is, when the data size of the video generated during the waiting time exceeds the capacity of the buffer, the host apparatus has to stop recording the video for a while.

Therefore, the host apparatus uses a method of controlling the NAND flash memory so as to secure a somewhat large logical space with no valid data to prevent the copying process and record video sequentially in the logical space. The logical space is generally known as an allocation unit (AU). The size of an AU is usually set to a power-of-two value in a conventional 2-level or 4-level NAND flash memory, from the viewpoint of the correspondence between logical addresses and physical addresses.

Figure 9:
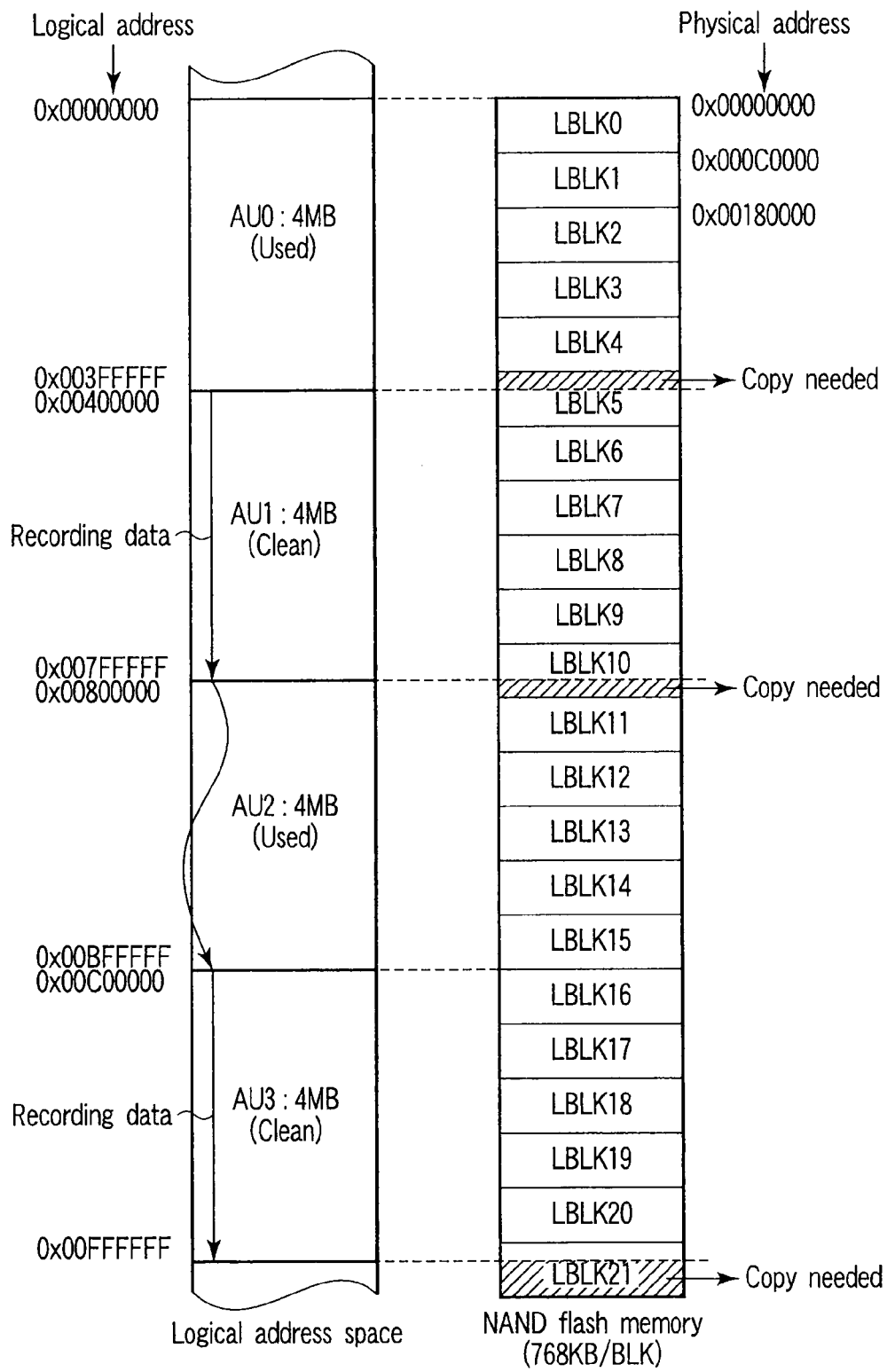
FIG. 9 is a conceptual diagram of the memory space and memory blocks in the flash memory.

However, in the case of a NAND flash memory where the number of bits in the data held in each memory cell transistor MT is not a power-of-two value, for example, in the case of an 8-level NAND flash memory, a copying process may be needed even if the AU is used. This case will be explained using FIG. 9. FIG. 9 is a conceptual diagram showing the correspondence between the logical address space and the individual memory blocks BLK in the 8-level NAND flash memory in a case where the size of one AU is 4 Mbytes and the size of a memory block BLK is 768 Kbytes. In FIG. 9, the memory blocks BLK in the NAND flash memory are shown in logical blocks which have consecutive addresses.

As shown in FIG. 9, for example, AU0 is a logical address space whose logical addresses range from "0x00000000" to "0x003FFFFF." AU1 is a logical address space whose logical addresses range from "0x00400000" to "0x007FFFFF." AU2 is a logical address space whose logical addresses range from "0x00800000" to "0x00BFFFFF." AU3 is a logical address space whose logical addresses range from "0x00C00000" to "0x00FFFFFF." AU0 and AU2 hold valid data. Neither AU1 nor AU3 has valid data. Accordingly, video is recorded consecutively in the memory blocks LBLK corresponding to "0x00400000" to "0x007FFFFF" in AU1 and then in the memory blocks BLK corresponding to "0x00C00000" to "0x00FFFFFF" in AU3.

Then, if the initial logical address in AU0 corresponds to the first page of logical block LBLK0, the initial logical address in AU1 corresponds to an intermediate page in logical block LBLK5 and the final logical address in AU1 corresponds to an intermediate page in logical block LBLK10. The initial logical address in AU3 corresponds to the first page in logical block LBLK16 and the final logical address in AU3 corresponds to an intermediate page in logical block LBLK21. The reason why the initial logical address or/and final logical address in each AU does not correspond to the first page of a logical block LBLK is that the size of each AU is a power-of-two value (e.g., 4 Mbytes) and the size of a logical block is not a power-of-two value (e.g., 768 Kbytes).

As a result, when video is recorded in the logical blocks LBLK5, LBLK10, LBLK21, a copying process is needed, since valid data has been held in the logical blocks LBLK. In FIG. 9, the regions needing a copying process are shown by shaded parts. Since a copying process is needed, it is very difficult to record the video continuously, even if AUs are secured.

Figure 10:
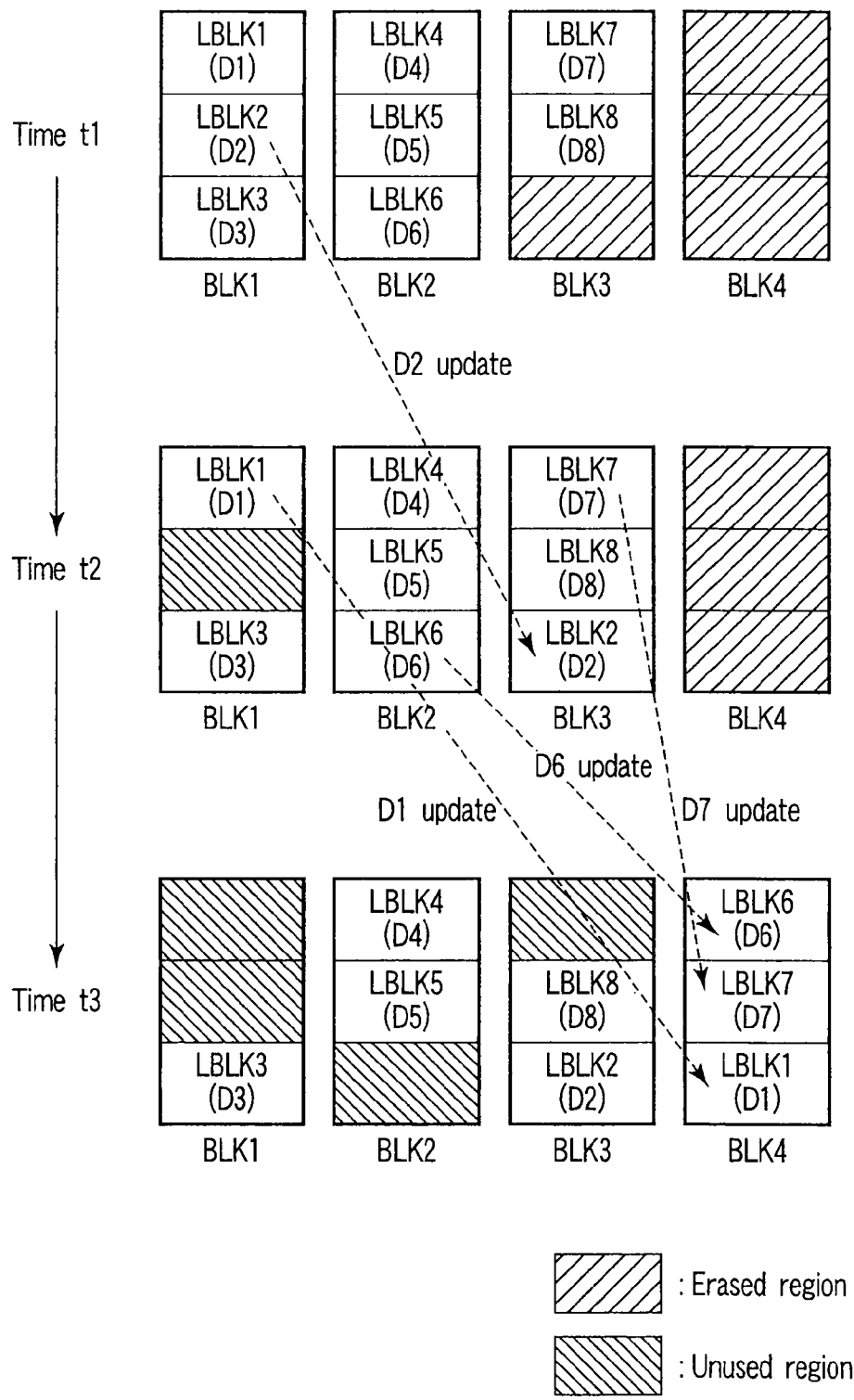
FIG. 10 is a block diagram of memory blocks included in the flash memory.

To overcome this problem, a method of setting the size of a logical block to, for example, ⅓ the size of a memory block BLK can be considered. In this case, the size of a logical block LBLK is 768K/3=256 Kbytes, which can be expressed by a power-of-two value. Accordingly, the size of an AU is an integral multiple of the size of a logical block LBLK, which makes it possible to avoid the problem. However, the erase unit, in other word the size of the memory block BLK, is 768 Kbytes. Accordingly, in this case, too, a copying process is needed. This will be explained using FIG. 10. FIG. 10 is a block diagram of four memory blocks BLK1 to BLK4, showing a state where each of the memory blocks is used between time t1 to time t3. FIG. 10 shows a case where a unit region serving as a logical block is of ⅓ the size of a memory block and logical addresses are allocated to 8 units in the unit region.

As shown in FIG. 10, suppose, at time t1, data D1 to data D8 are held in the logical blocks LBLK1 to LBLK8 and a part of memory block BLK3 and memory block BLK4 are in the erased state. In this state, suppose data D2 is updated at time t2. Then, the updated data D2 is written to the erased region of the memory block BLK3. From this point on, the region becomes logical block LBLK2. Logical block LBLK2 in which data D2 before update is held is set unused. At time t3, data D6, data D7, and data D1 are updated. As shown in FIG. 10, the updated data D6, D7, and D1 are written to memory block BLK4. Thereafter, the individual regions in the memory block BLK4 become logical blocks LBLK6, LBLK7, LBLK1, respectively. Then, the regions in which data D6, data D7, and data D1 are held are set unused.

As a result, the erased memory blocks BLK disappear at time t3. That is, when data write access is performed randomly, the valid data in each memory block BLK decreases and, at the same time, the number of erased memory blocks BLK also decreases. If erased memory blocks BLK run out, the data, hereinafter, cannot be updated. To prevent erased memory blocks BLK from running out, a method called garbage collection is used.

Garbage collection is a method of copying the valid data in several memory blocks BLK in which valid data has decreased to another erased memory block BLK, clearing the original memory blocks, and using these as cleared memory blocks BLK. However, garbage collection is also an internal copying process. Accordingly, the copying process may prevent the host apparatus from recording video.

In this respect, with the configuration of the first embodiment, a data copying process is not needed, which solves the problem. This will be explained using FIG. 11. FIG. 11 is a conceptual diagram showing the correspondence between the logical address space and memory blocks BLK in an 8-level NAND flash memory of the first embodiment in a case where the size of one AU is 4 Mbytes as in FIG. 9.

As shown in FIG. 11, in the 8-level NAND flash memory, the size of one memory block BLK is 512 Kbytes and can be expressed by a power-of-two value. Accordingly, the size of each AU is an integral multiple of a memory block BLK. For example, if the size of an AU is 4 Mbytes, the size is equal to eight memory blocks BLK. That is, in any AU, the initial logical address corresponds to the first page of any one of the logical blocks LBLK. The final logical address corresponds to the final page of any one of the logical blocks LBLK.

As shown in FIG. 11, the initial logical address "0x00000000" in AU0 corresponds to the first page of logical block LBLK0. The final logical address "0x003FFFFF" corresponds to the last page of logical block LBLK7. The initial logical address "0x00400000" in AU1 corresponds to the first page of logical block LBLK8. The final logical address "0x007FFFFF" corresponds to the last page of logical block LBLK15. The initial logical address "0x00800000" in AU2 corresponds to the first page of logical block LBLK16. The final logical address "0x00BFFFFF" corresponds to the last page of logical block LBLK23. The initial logical address "0x00C00000" in AU3 corresponds to the first page of logical block LBLK24. The final logical address "0x00FFFFFF" corresponds to the last page of logical block LBLK31.

Accordingly, when video is recorded in units of AU consecutively, a copying process is not needed. Therefore, when recording the video, the host apparatus has no waiting time. Moreover, the garbage collection as explained in FIG. 10 is not needed. Consequently, even when the data size of the video is large, they can be recorded without interruption, which improves the data retention reliability of the NAND flash memory.

As described above, to set the size of a memory block BLK in the 8-level NAND flash memory to a power-of-two value, the first embodiment sets the number of word lines WL to 43, not a power-of-two value, and does not use any one of the pages (page PG128). In other words, it can be said that a memory cell transistor MT connected to any one of the word lines WL is caused to hold 4-level (2-bit) data, "00," "01," "10," and "11." This will be explained using FIG. 12. FIG. 12 is a circuit diagram of a memory block BLK.

For example, if pages PG0 to PG128 are allocated to word lines WL0 to WL42, respectively, the memory cell transistors MT connected to word lines WL0 to WL41 hold 8-level (3-bit) data as shown in FIG. 12. In contrast, the memory cell transistors MT connected to word line WL42 hold 4-level (2-bit) data. As a result, the size of one memory block BLK is 512 Kbytes.

In the first embodiment, if the size of a memory block BLK is a power-of-two value, this is sufficient and the number of word lines WL may be selected suitably. FIG. 13 is a circuit diagram of a memory block BLK included in an 8-level NAND flash memory according to a first modification of the first embodiment.

As shown in FIG. 13, the number of word lines WL is 44. The memory cell transistors MT connected to word lines WL1 to WL42 hold 8-level data. The memory cell transistors MT connected to word lines WL0, WL43 hold 2-level (1-bit) data, "0," and "1." With this configuration, too, the number of pages included in one memory block BLK is (42 WL×3 bits+2 WL×1 bit)=128 pages. Accordingly, the size of a memory block BLK is 512 Kbytes, which produces the same effect as that of the first embodiment.

Moreover, this configuration enables the NAND flash memory to improve its data retention characteristic. The reliability of the begin word line (word line WL0 in FIG. 13) and end word line (word line WL43 in FIG. 13) in a NAND cell may become lower than that of the other word lines (word lines WL1 to WL42 in FIG. 13) because of a manufacturing problem. To overcome this, the memory cell transistors MT connected to the lower-reliability word lines WL0 and WL43 are caused to hold 2-level data, not multilevel data, which enables the retention characteristic of the NAND flash memory to be improved.

Figure 14:
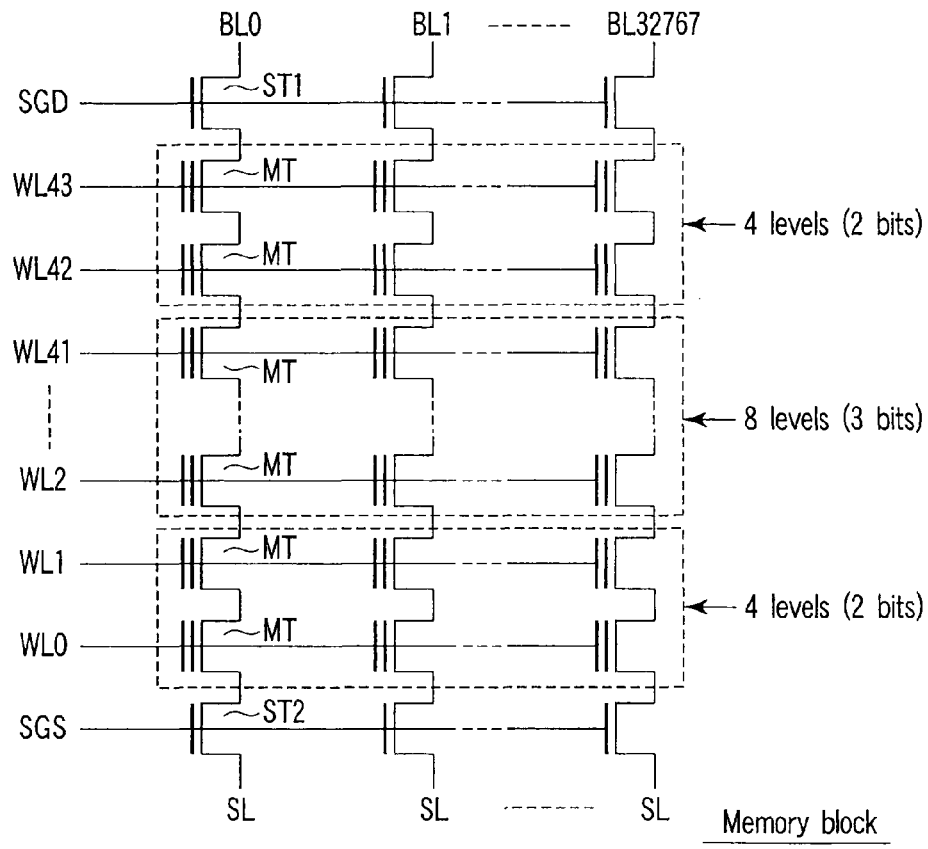

Furthermore, the first embodiment can be modified as shown in FIG. 14. FIG. 14 is a circuit diagram of a memory block BLK included in an 8-level NAND flash memory according to a second modification of the first embodiment.

As shown in FIG. 14, the number of word lines WL is 44. The memory cell transistors MT connected to word lines WL2 to WL41 hold 8-level data. The memory cell transistors MT connected to word lines WL0, WL1, WL42, WL43 hold 4-level (2-bit) data. With this configuration, too, the number of pages included in one memory block BLK is (40 WL×3 bits+4 WL×2 bit)=128 pages. Accordingly, the size of a memory block BLK is 512 Kbytes, which produces the same effect as that of the first embodiment. Furthermore, the memory cell transistors MT connected to word lines WL0, WL1, WL42, WL43 at the ends of the NAND cell are caused to hold a smaller number of bits of data (2 bits) than the data (3 bits) held by the other memory cell transistors MT, which enables the retention characteristic of the NAND flash memory to be improved.

In the first embodiment and its modifications, the case where the number of bit lines is 32K lines has been explained. The number of bit lines BL may be, for example, 64K lines. In this case, the size of each memory block BLK is 1024 Kbytes. Of course, the number of bit lines BL is not limited to 32K or 64K lines and may be selected suitably, preferably a power-of-two value.

Second Embodiment

Figure 15:
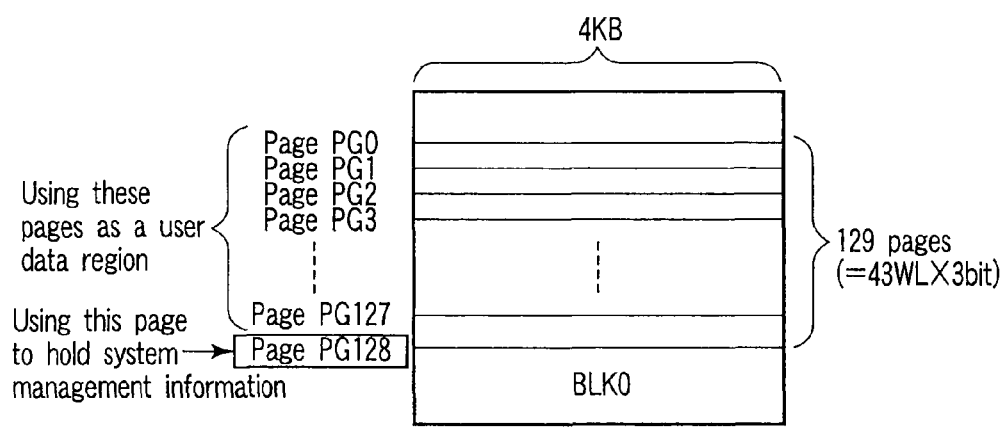
FIG. 15 is a block diagram of a memory block included in a flash memory according to a second embodiment of the invention.

Next, a semiconductor memory device and a memory system according to a second embodiment of the invention will be explained. The second embodiment is such that a page not used in the first embodiment is used as a storage page for system management information and the like. Since the configuration of the memory system and the configuration of the card controller 12 and NAND flash memory 11 are as shown in FIGS. 1 to 6 explained in the first embodiment, an explanation of them will be omitted. FIG. 15 is a block diagram of a memory block BLK included in an 8-level NAND flash memory 11 of the second embodiment, showing a memory block BLK in pages. Although only memory block BLK0 is shown in FIG. 15, the same holds true for the other memory blocks BLK1 to BLKm.

As shown in FIG. 15, since each memory cell transistor MT is capable of holding 3-bit data as in the first embodiment, each memory block BLK has (43 WL×3 bits)=129 pages. Of them, pages PG0 to PG127 are used as a user data region. That is, the size of the region the user can use is 512 Kbytes. Page PG128 not used in the first embodiment is used as a system management information storage page. The page PG128 is so configured that it can be accessed from the card controller 12 but cannot be accessed from the host apparatus 2. Accordingly, the size of one memory block BLK viewed from outside the memory card 1 is 512 Kbytes.

Figure 16:
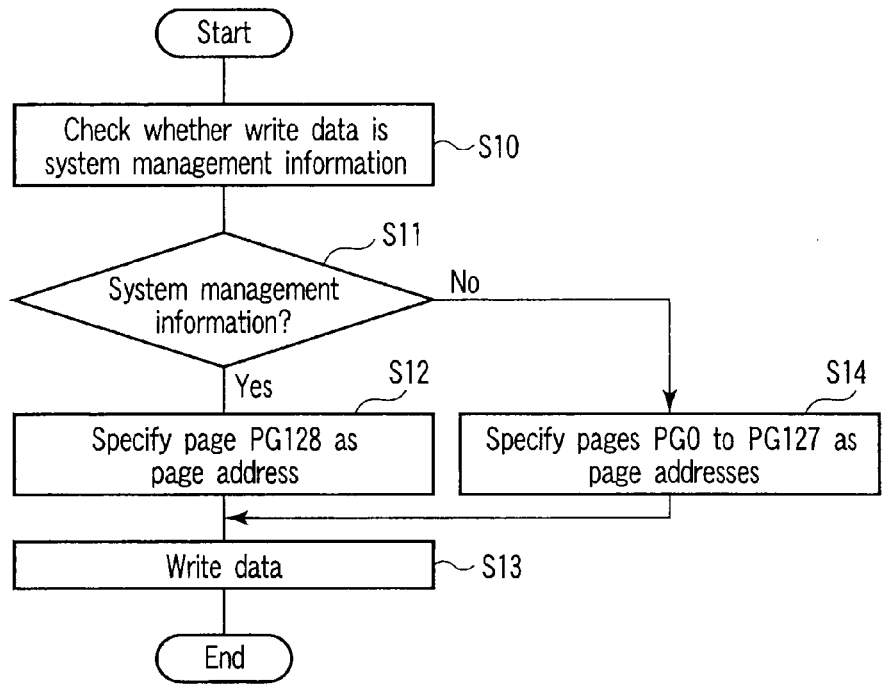
FIG. 16 is a flowchart to help explain a data writing method for a card controller according to the second embodiment.

Next, the operation of the card controller 12 in writing data will be explained using FIG. 16. FIG. 16 is a flowchart to help explain the operation of the card controller 12.

As shown in FIG. 16, the MPU 22 of the card controller 12 checks whether the write data is system management information (step S10). The system management information includes, for example, attributes for each sector (a region of a specific size, for example, containing 512 bytes) in an erase block. Specifically, the attributes include write protect information (whether or not the data is overwrite inhibit data), a security guard release key, and parity information in the column direction in the memory cell array. These pieces of information may be the information generated by the MPU 22 in the card controller 12 and held in the RAM 25 or the information held in the ROM 24, not the information supplied as user data from the host apparatus 2 to the memory card 1. Accordingly, in the checking process in step S10, a determination can be made, depending on whether or not the write data is the data supplied from the host apparatus 2.

If the write data is system management information (YES in step S11), the MPU 22 specifies page PG128 as a page address (step S12). Then, in the NAND flash memory 11, the system management information is written to page PG128 (step S13).

If the write data is not system management information (NO in step S11), the MPU 22 specifies any one of pages PG0 to PG127 as a page address (step S14). Then, in the NAND flash memory 11, data is written to any one of pages PG0 to PG127 (step S13).

In other words, the memory block BLK includes a first memory region having pages PG0 to PG127 and a second memory region having page PG128. The first memory region is a memory space (512 Kbytes) formed by 3 bits held in each of the memory cell transistors MT connected to word lines WL0 to WL41 and 2 bits held in each of the memory cell transistors MT connected to word line WL42. The second memory region is a memory space (4 Kbytes) formed by the remaining 1 bit in each of the memory cell transistors MT connected to word line WL42. The MPU 22 writes the data supplied from the host apparatus 2 to the first memory region and the data generated by itself to the second memory region.

As described above, the NAND flash memory of the second embodiment produces not only the effect in Item (1) explained in the first embodiment but also the effect described in Item (2), below.

(2) Reducing the redundant part of the NAND flash memory suppresses the enlargement of area of the memory cell array due to the use of the redundant page.

As described in the first embodiment, if the number of word lines WL is 43, the number of bit lines BL is 32K, and the size of a memory block BLK is 512 Kbytes, page PG128 is a redundant page. In the second embodiment, the redundant page is used to hold system management information.

Previously, system management information was written to the redundant part provided for each page. The redundant part corresponds to, for example, the second region explained in FIG. 5. In the second embodiment, however, since system management information is written to the redundant page, the size of the second region can be reduced. As a result, the occupied area of the memory cell array 30 can be decreased. Of course, the redundant page is not limited to page PG128 and may be any one of pages PG0 to PG128.

The second embodiment may be applied to each of the first and second modifications of the first embodiment. For example, in FIG. 13, for example, 4-level data, not 2-level data, is held in the memory cell transistor MT connected to word line WL43. Then, the number of pages included in one memory block BLK is (42 WL×3 bits+1 WL×1 bit+1 WL×2 bits)=129 pages, which produces one redundant page.

In FIG. 14, for example, 8-level data, not 4-level data, is held in the memory cell transistor MT connected to word line WL42. Then, the number of pages included in one memory block BLK is (41 WL×3 bits+3 WL×2 bits)=129 pages, which produces one redundant page.

Third Embodiment

Figure 17:
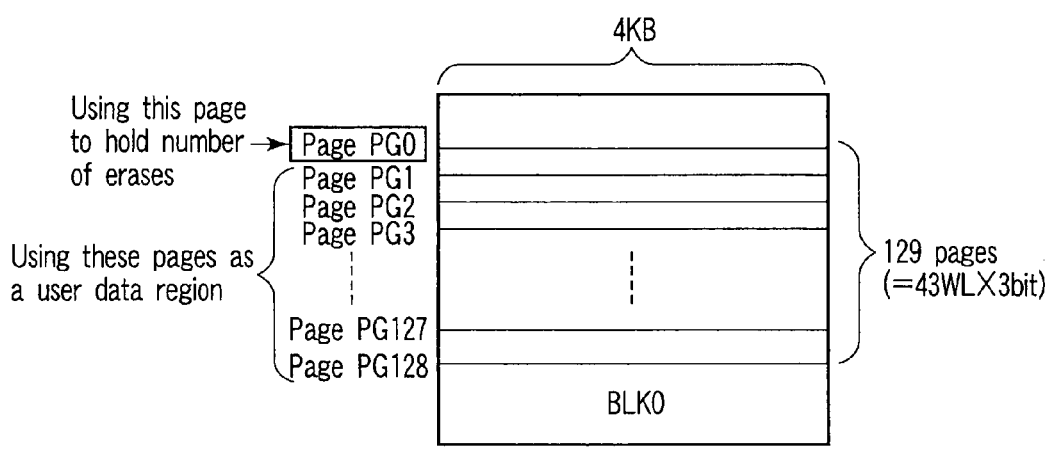
FIG. 17 is a block diagram of a memory block included in a flash memory according to a third embodiment of the invention.

Next, a semiconductor memory device and a memory system according to a third embodiment of the present invention will be explained. Like the second embodiment, the third embodiment is related to how to use a page not used in the first embodiment. In the third embodiment, the redundant page is used to hold the number of erases. Since the configuration of the memory system and the configuration of the card controller 12 and NAND flash memory 11 are as shown in FIGS. 1 to 6 explained in the first embodiment, an explanation of them will be omitted. FIG. 17 is a block diagram of a memory block BLK included in an 8-level NAND flash memory 11 of the third embodiment, showing a memory block BLK in pages. Although only memory block BLK0 is shown in FIG. 17, the same holds true for the other memory blocks BLK1 to BLKm.

As shown in FIG. 17, since each memory cell transistor MT is capable of holding 3-bit data as in the first embodiment, each memory block BLK has (43 WL×3 bits)=129 pages. Of them, pages PG1 to PG128 are used as a user data region. That is, the size of the region the user can use is 512 Kbytes. Page0 as a redundant page is used as a storage page for the number of erases in each memory block BLK. Page PG0 is so configured that it can be accessed from the card controller 12 but cannot be accessed from the host apparatus 2. Accordingly, the size of one memory block BLK viewed from outside the memory card 1 is 512 Kbytes. This is the same as in the second embodiment.

Figure 18:
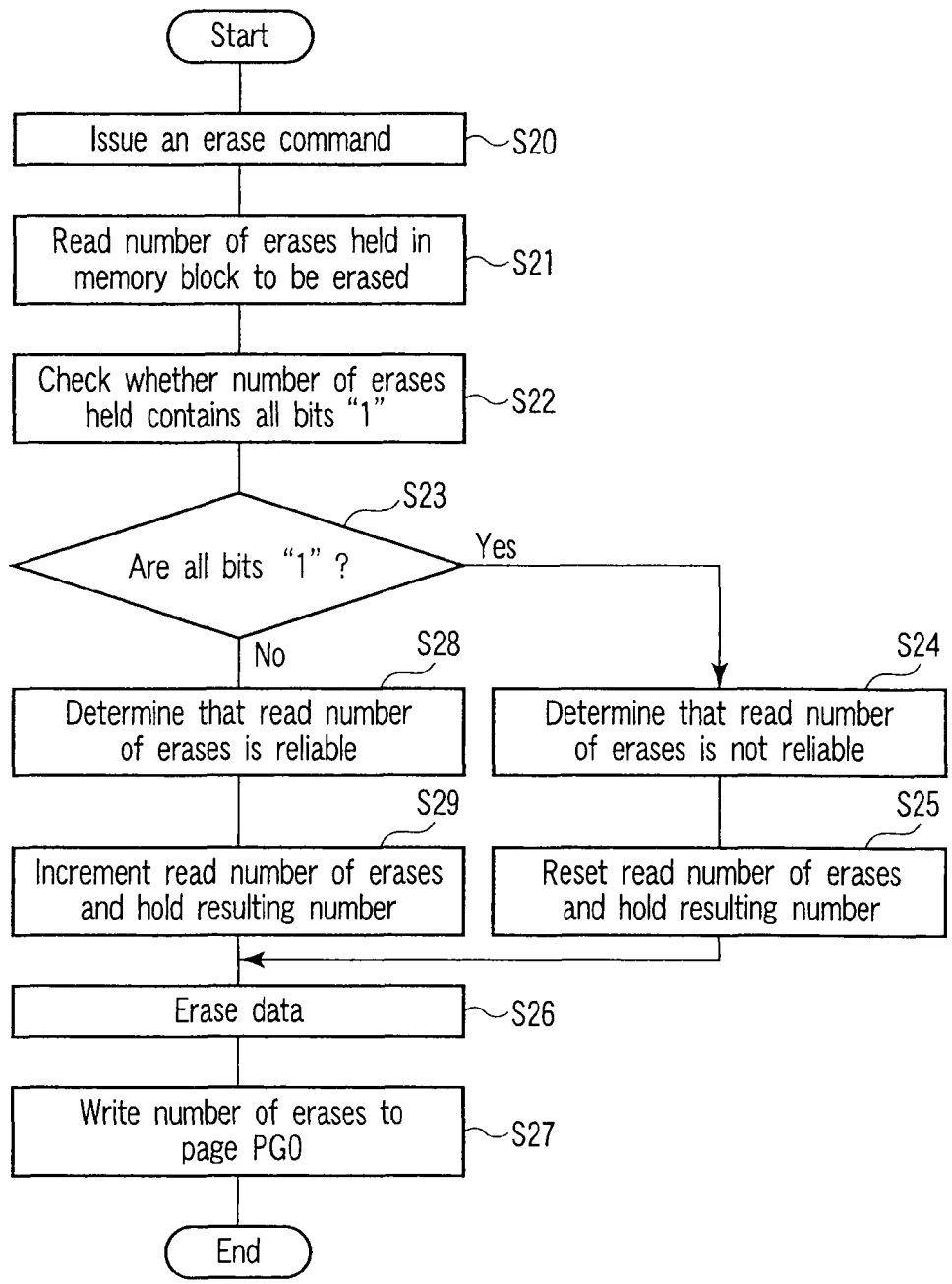
FIG. 18 is a flowchart to help explain a data erasing method for a card controller according to the third embodiment.

Next, the operation of the card controller 12 in erasing data will be explained using FIG. 18. FIG. 18 is a flowchart to help explain the operation of the card controller 12. The operation of FIG. 18 may be carried out by a control circuit (not shown) provided in the NAND flash memory 11.

As shown in FIG. 18, the MPU 22 of the card controller 12 issues an erase command (step S20). Next, the MPU 22 accesses page PG0 of memory block BLK to be erased and reads the number of erases recorded in page PG0 (step S21). Then, the MPU 22 determines whether the value indicating the number of erases contains all bits "1" (step S22). For example, the value indicating the number of erases is 32-bit data, the MPU 22 determines whether the data is "0xFFFF." This determination is made to determine whether or not the number of erases is reliable.

If all the bits are "1" (YES in step S23), the MPU 22 determines that the data is not reliable (step S24). The fact that all the bits are "1" means that the memory cell transistor MT holding the number of erases is in the erased state. Accordingly, it is conceivable that the data has been erased for some reason. Accordingly, the MPU 22 resets the number of erases read from the page PG0 and holds the resulting number (step S25). That is, the MPU 22 sets the number of erases to "1." Then, in the NAND flash memory, the memory block BLK is erased (step S26). By the erase operation, the data held in the memory cell transistor MT in the memory block BLK are all erased at the same time. Thereafter, the card controller 12 writes the number of erases ("1") held in step S25 to redundant page PG0 of the memory block BLK.

If any one of the bits is "0" in step S22 (NO in step S23), the MPU 22 determines that the data is reliable (step S28). Then, the MPU 22 increments the number of erases read from the page PG0 and holds the resulting number (step 29). Then, the data is erased (step S26) and the incremented value in step S29 is written to page PG0 as a new number of erases.

While in FIGS. 17 and 18, only the number of erases has been written to the redundant page, not only the number of erases but also a detailed status about the erase operation may be written in step S27 of FIG. 18.

In other words, as in the second embodiment, a memory block BLK includes a first memory region and a second memory region in the third embodiment. The MPU 22 writes user data to the first memory region and the number of erases and status to the second region.

As described above, the NAND flash memory of the third embodiment produces not only the effect in Item (1) explained in the first embodiment but also the effects described in Items (3) to (5), below. When the NAND flash memory 11 has the function of writing the number of erases and status to a memory cell array 30 automatically, the effects described in Items (3) to (5) are particularly obtained. When the card controller 12 has the function, the effects described in Items (4) and (5) are particularly obtained.

(3) The malfunction analysis efficiency of the NAND flash memory can be improved.

Figure 19:
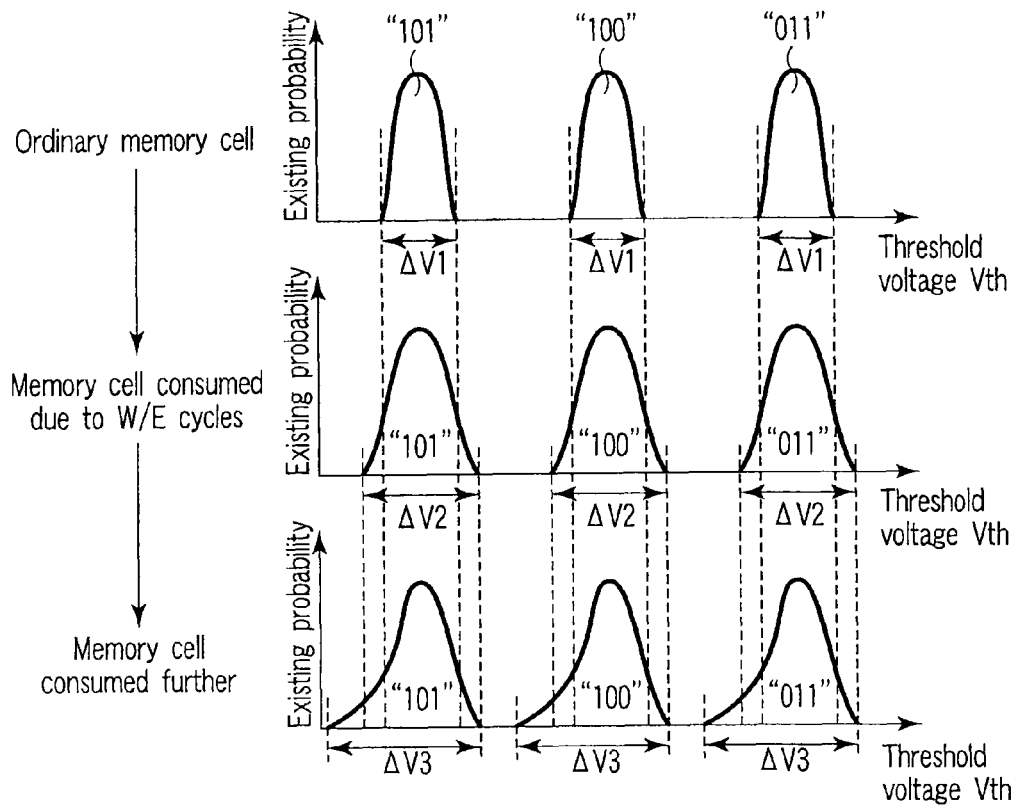
FIG. 19 is a graph showing a threshold value distribution of a memory cell transistor included in the flash memory, showing the way the threshold distribution width increases as a result of consumption.

In the NAND flash memory, when the write/erase cycle (hereinafter, sometimes referred as the W/E cycle) is repeated, the characteristics of the memory cell transistor MT deteriorate. This will be explained using FIG. 19. FIG. 19 is a graph showing a threshold value distribution of a memory cell transistor MT. In the graph, as the W/E cycle is repeated, the threshold value distribution changes. FIG. 19 shows the threshold voltages of data "101," data "100," and data "011" as an example.

As shown in FIG. 19, suppose the distribution width of the threshold voltage of an ordinary memory cell transistor MT is ΔV1. When the W/E cycle is repeated, the distribution width extends from ΔV1 to ΔV2. As the W/E cycle is further repeated and the memory cell transistor MT is consumed, the threshold voltage distribution extends toward the low-voltage side and its distribution width extends to ΔV3.

When the threshold voltage distribution width exceeds a certain value, bit errors occur so frequently when data is read that the ECC circuit cannot correct the errors. That is, the data cannot be read, resulting in the malfunction of the NAND flash memory.

At this time, if whether the number of rewrites for the troubled memory block due to reading malfunction is less than a guaranteed value can be determined, it is possible to determine whether the reading malfunction occurred has been caused by the product's service life.

Moreover, in the block consumed as a result of the repletion of the W/E cycle, a status error is liable to occur because the write or erase operation has not been completed. Such a memory block is called a defective block.

Generally, in the NAND flash memory, the guaranteed value of the number of rewrites and the number of valid blocks other than the defective blocks (the number of the memory blocks excluding defective blocks) have been determined. When the number of the defective blocks is increased and the number of the valid blocks becomes lower than the guaranteed value, the NAND flash memory malfunctions.

Furthermore, when the number of the defective blocks is increased in the NAND flash memory and the guaranteed number of blocks cannot be satisfied, if the defective blocks are known, whether the defect has resulted from the product's service life can be determined, depending on whether the number of erases in the memory block has exceeded the guaranteed value of the number of rewrites. Even if the defective block is unknown, the number of erases in all the blocks in the NAND flash memory is read and is compared with the guaranteed value of the number of rewrites, which makes it possible to roughly determine whether the malfunction has been caused by the service life.

With the configuration of the third embodiment, reading the data from redundant page PG0 makes it possible to grasp the number of erases in the memory block BLK, that is, the number of rewrites. Specifically, redundant page PG0 can be used to analyze the defect in the faulty NAND flash memory, which improves the malfunction analysis efficiency. For example, if the number of erases read from the redundant page of the faulty memory block has exceeded the guaranteed value of the number of rewrites, it is determined that the malfunction has resulted from the product's service life.

(4) The operational reliability of the NAND flash memory can be improved.

With the configuration of the third embodiment, write conditions or read conditions are set according to the number of erases and status written in the redundant page, thereby improving the operational reliability of the NAND flash memory. This effect will be explained in detail below.

Figure 20:
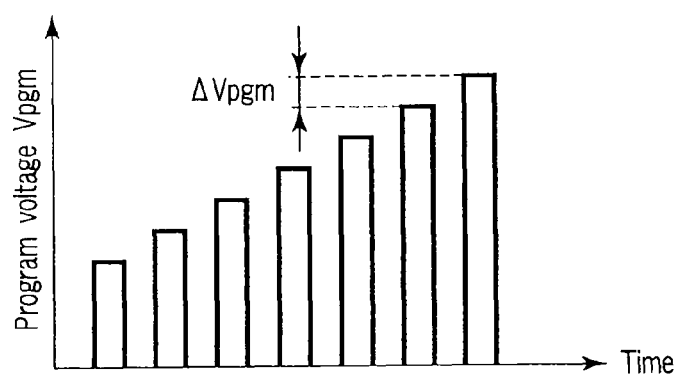
FIG. 20 is a graph showing a change in the write voltage of the flash memory.

FIG. 20 is a graph showing the change of a program voltage Vpgm with respect to time in writing data. As shown in FIG. 20, in the NAND flash memory, a write operation is carried out, while the program voltage Vpgm applied to the word line WL is being raised gradually. Each time a write operation is carried out, verifying is performed. Let a variation in the program voltage Vpgm at this time be ΔVpgm. In a write operation, for example, the voltage ΔVpgm is changed according to the data in the redundant page.

Figure 21:
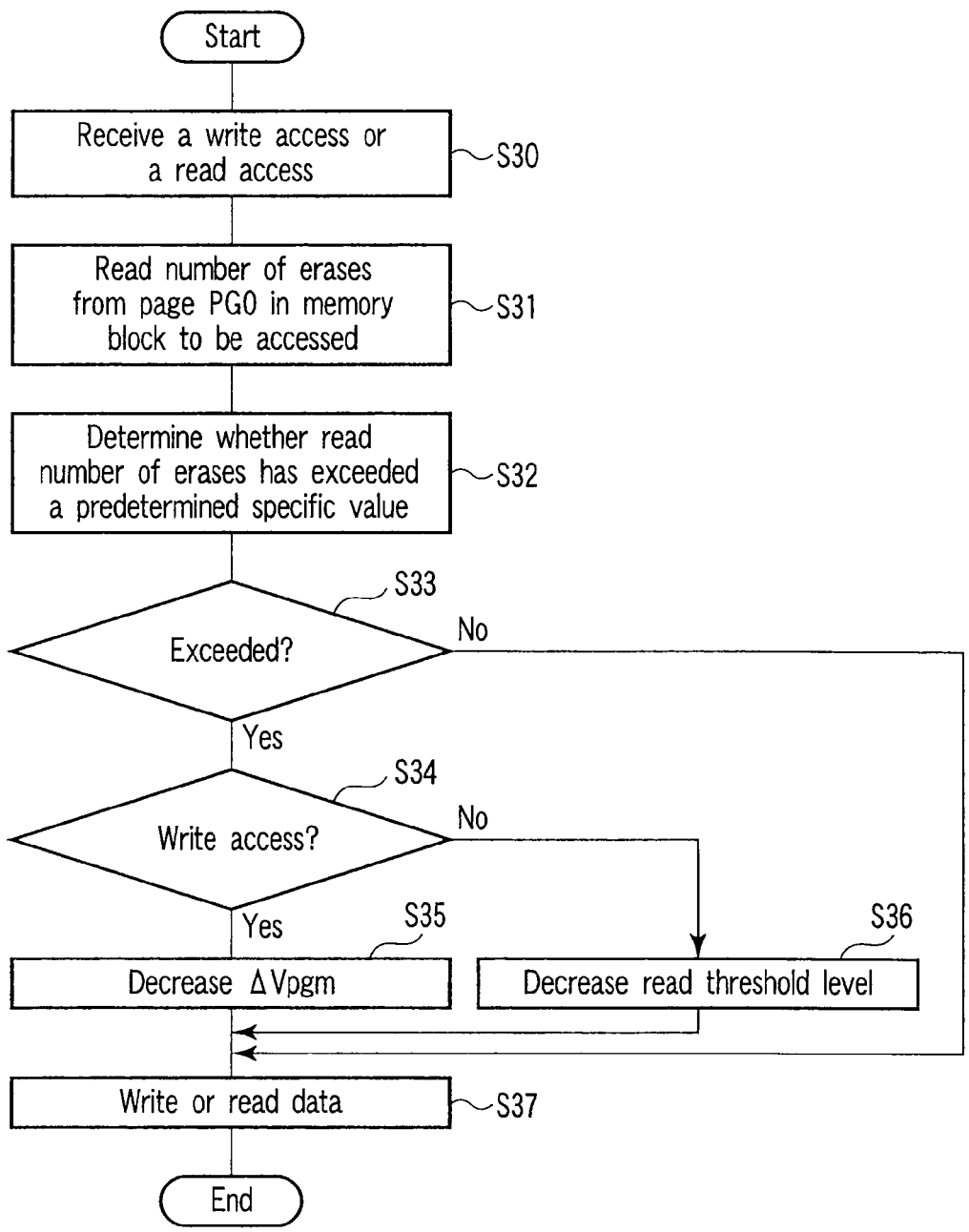
FIG. 21 is a flowchart to help explain a data writing method and a data reading method in the flash memory or card controller according to the third embodiment.

Hereinafter, the operation of the NAND flash memory in a write operation and in a read operation will be explained using FIG. 21. FIG. 21 is a flowchart to help explain the operation of the control circuit (not shown) in the NAND flash memory 11.

As shown in FIG. 21, when receiving a write access or a read access from the card controller 12 (step S30), the control circuit reads the number of erases from redundant page PG0 of the memory block BLK to be accessed (step S31). At this time, the control circuit may read the status at the same time. Then, the control circuit determines whether the read number of erases has exceeded a predetermined specific value (step S32). The specific value may be a value written to a ROM or the like in the NAND flash memory in the manufacturing stage or data that can be updated during use. The specific value serves as a reference in determining whether the memory block BLK has been consumed beyond a certain level.

When the read number of erases has exceeded the specific value (YES in step S33), the control circuit determines that the memory block BLK has been consumed beyond a certain level. Then, when having received a write access (YES in step S34), the control circuit makes the voltage ΔVpgm lower than when the memory block BLK was not consumed (step S35). When having received a read access (NO in step S34), the control circuit sets the read threshold level lower than when the memory block BLK was not consumed (step S36). Then, the control circuit writes or reads the data using the setting value in step S35 or S36.

Generally, in a memory cell transistor MT where the W/E cycle has been repeated, charges are liable to accumulate in the charge accumulation layer in a write operation. Moreover, the data retention characteristic deteriorates and charges are more liable to escape as time passes. With the method of the third embodiment, however, when data is written to a consumed memory cell transistor MT, ΔVpgm is made lower, which makes it possible to suppress the extension of the width of the data threshold value distribution. When data is read, the read threshold level is set lower, taking the escape of charges into account, which makes it possible to suppress the occurrence of erroneous reading. As a result, the operational reliability of the NAND flash memory can be improved.

If the control circuit does not have the above function, the card controller 12 may be provided with the same function. Specifically, in case of a write access to the NAND flash memory 11, the card controller 12 reads the data in the redundant page in advance and issues to the NAND flash memory 11 a parameter change command to change ΔVpgm according to the number of erases or status. Similarly, in a read operation, the card controller 12 reads the data in the redundant page in advance and issues a change command to decrease the read threshold level. Moreover, the card controller 12 may issue a change command to decrease the threshold level in a reload operation when an ECC correction cannot be made. This makes it possible to remedy a consumed memory cell transistor MT.

(5) The service life of the NAND flash memory can be extended.

With the configuration of the third embodiment, the number of erases written in the redundant page is referred to, which makes it possible to equalize the number of erases in the memory blocks BLK0 to BLKm in the memory cell array 30. This can be realized by decreasing the frequency of use of memory blocks BLK whose number of erases is large and preferentially using the memory blocks BLK whose number of erases is small. This makes it possible to suppress the occurrence of defective blocks and extend the service life of the NAND flash memory 11. This method will be explained in detail below.

The card controller 12 divides the memory blocks BLK into, for example, three categories according to the number of erases. Memory blocks BLK whose number of erases is less than a predetermined specific value belong to first category. The memory blocks BLK belonging to the first category are used to hold system data (e.g., FAT file systems). Memory blocks BLK whose number of erases is greater than that of the first category belong to second category. The memory blocks BLK belonging to the second category are used to hold ordinary data. Memory blocks BLK whose number of erases is greater than that of the second category belong to third category. The memory blocks BLK belonging to the third category are treated as isolated blocks which are normally not used. Then, the card controller 12 stores in, for example, the RAM 25 what category which memory block BLK belongs to.

Figure 22:
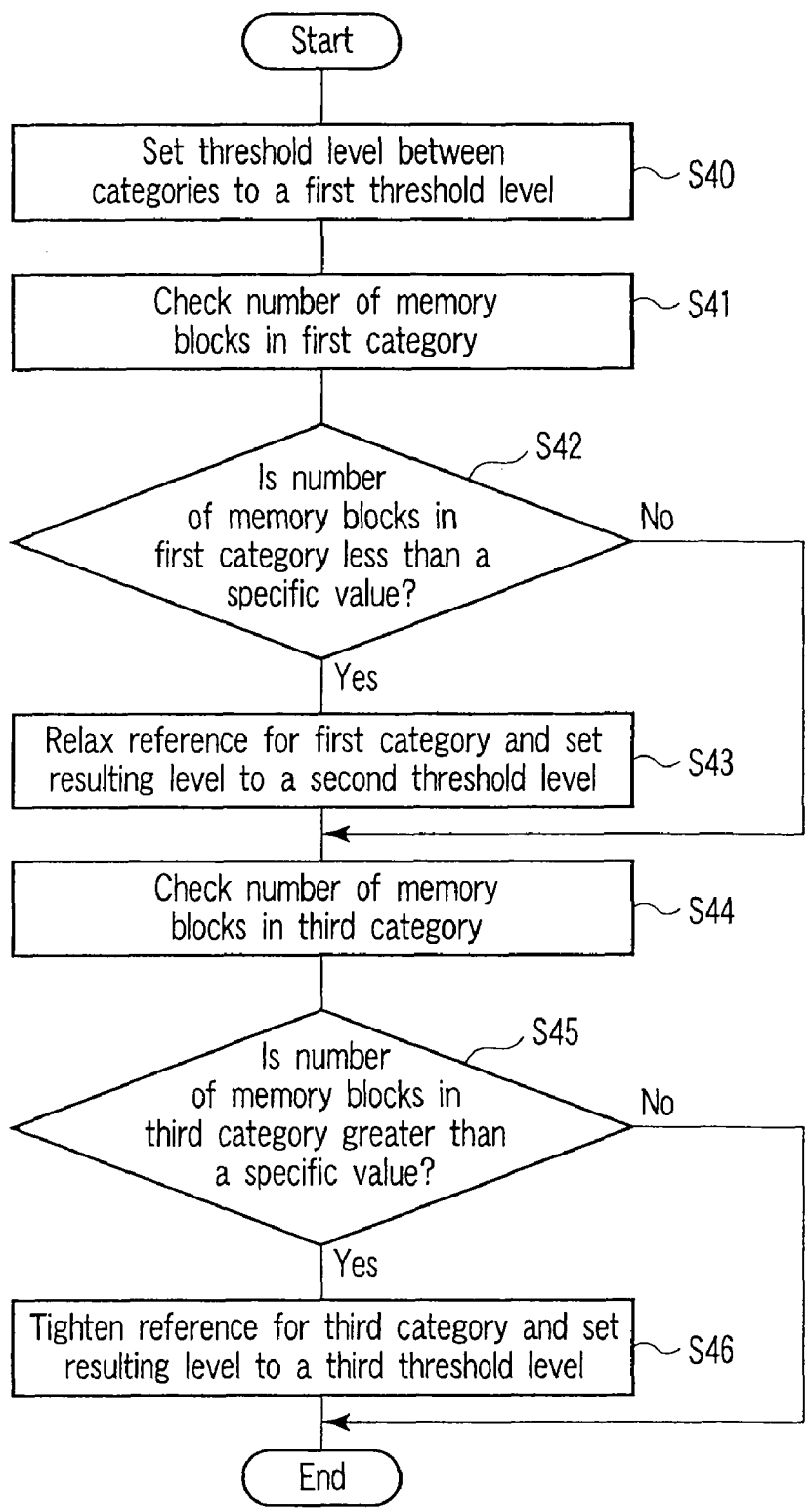
FIG. 22 is a flowchart to help explain a number-of-erases equalizing method in the flash memory or card controller of the third embodiment.

Furthermore, the card controller 12 controls the threshold level of the number of erases between the categories according to the number of memory blocks BLK belonging to each category. This prevents only the memory blocks BLK belonging to any one of the categories from increasing outstandingly. This method will be explained using FIG. 22. FIG. 22 is a flowchart to help explain a method of controlling the threshold level of the number of erases between the categories in the card controller 12.

As shown in FIG. 22, the card controller 12 sets the threshold value between the categories to a first threshold level (step S40). On the basis of the first threshold level, the number of memory blocks belonging to first category to third category is determined. Then, the card controller 12 checks the number of memory blocks belonging to the first category (step S41). If the number of memory blocks belonging to the first category is less than a predetermined specific value (YES in step S42), the card controller 12 relaxes the reference for the first category (step S43). Let the resulting threshold level be a second threshold level. Next, the card controller 12 checks the number of memory blocks belonging to the third category with the second threshold level (step S44). If having determined in step S41 that the number of memory blocks is not less than the specific value (NO in step S42), the card controller 12 proceeds to step S44. If the number of memory blocks belonging to the third category is greater than a predetermined specific value (YES in step S45), the card controller 12 tightens the reference for the third category (step S46). Let the resulting threshold level be a third threshold level. Hereinafter, each time the W/E cycle is performed, the processes in step S41 and forward are repeated, thereby setting the references for the first category and the third category again.

Figure 23:
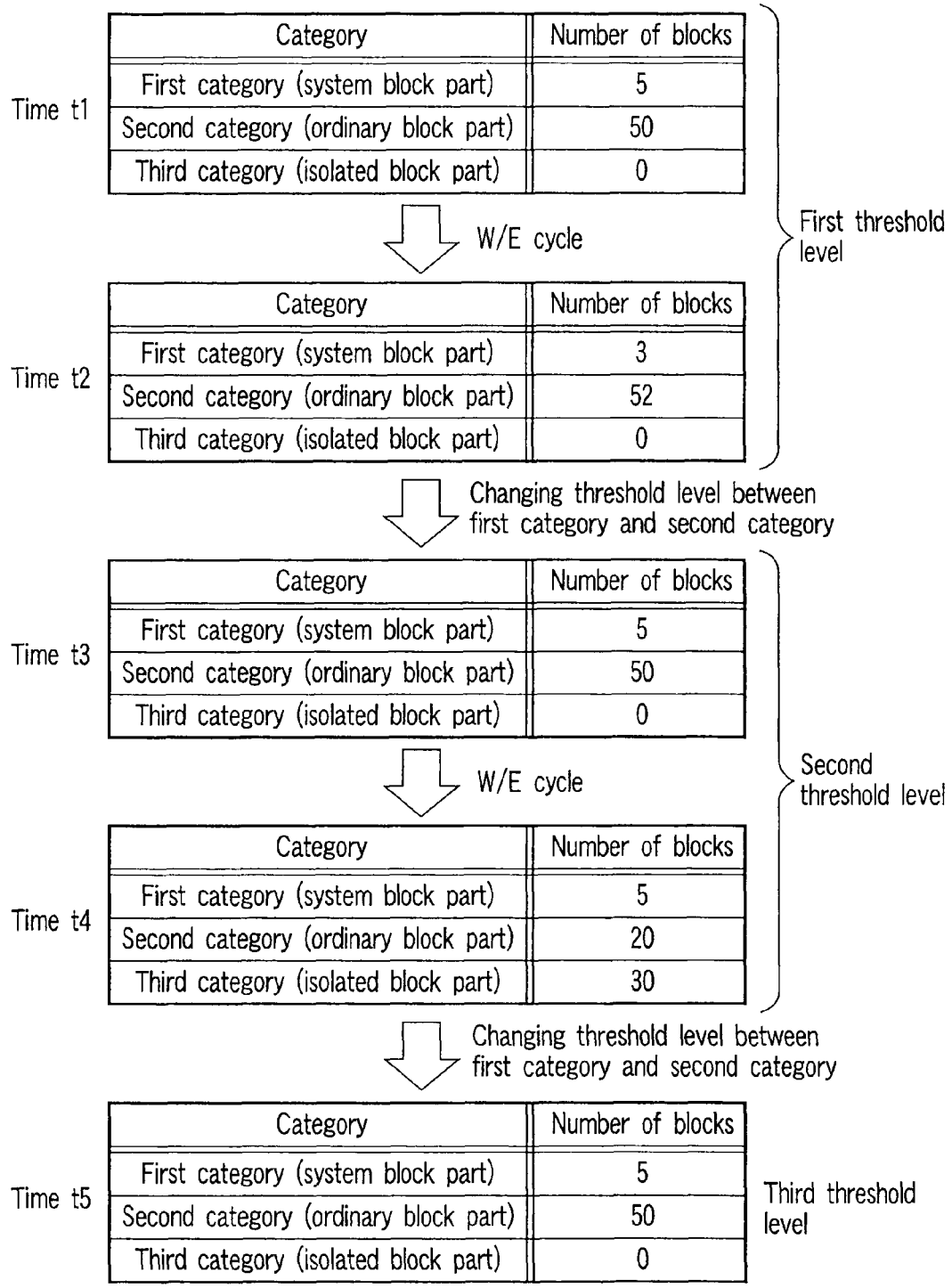
FIG. 23 is a schematic diagram to help explain the number-of-erases equalizing method in the flash memory or card controller of the third embodiment, showing a change in the number of memory blocks belonging to each category with respect to time.
Figure 24:
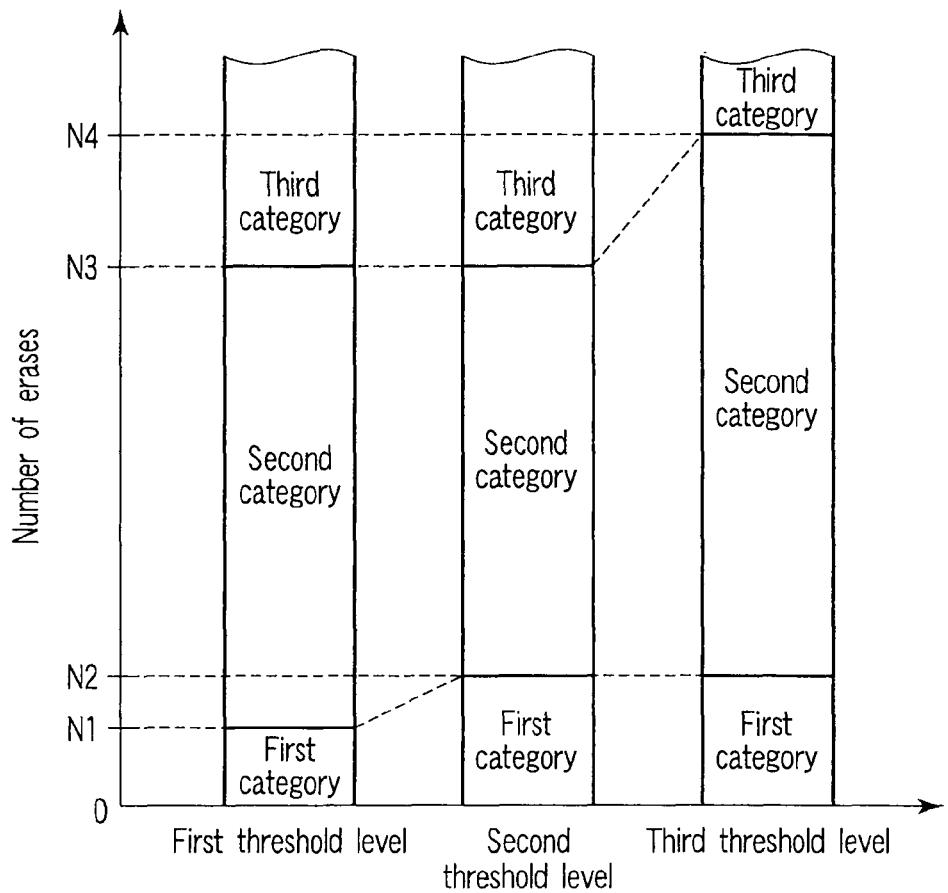
FIG. 24 is a graph showing the relationship between the threshold level between categories and the number of erases in equalizing the number of erases in the flash memory or card controller of the third embodiment.

Concrete examples of what has been described above will be explained using FIGS. 23 and 24. FIG. 23 shows tables to help explain the individual categories and the number of memory blocks belonging to them, particularly illustrating the way the memory blocks belonging to the individual categories change each time the W/E is repeated. FIG. 24 is a graph showing the relationship between the threshold level between categories and the number of erases at the threshold level.

First, at time t1, the card controller 12 sets a first threshold level. The first threshold level is the following condition as shown in FIG. 24: a memory block BLK whose number of erases is less than N1 belongs to the first category, a memory block BLK whose number of erases is greater than or equal to N1 and less than N3 belongs to the second category, and a memory block BLK whose number of erases is greater than or equal to N3 belongs to the third category. Suppose 5 memory blocks BLK belong to the first category, 50 memory blocks BLK belong to the second category, and no memory block BLK belongs to the third category as shown in FIG. 23. Further suppose these numbers are the optimum values.

Thereafter, suppose, as a result of the repetition of the W/E cycle, 3 memory blocks BLK belong to the first category, 52 memory blocks BLK belong to the second category, and no memory block BLK belongs to the third category at time t2 as shown in FIG. 23. That is, the number of memory blocks belonging to the first category has decreased too much and the number of memory blocks is too small to record the system information (YES in step S42 in FIG. 22).

Then, the card controller 12 changes the threshold level between the first category and the second category (step S43 in FIG. 22). That is, as shown in FIG. 24, the card controller 12 changes the threshold level between the first category and the second category to N2 (>N1). As a result, 5 memory blocks belong to the first category, 50 memory blocks belong to the second category, and no memory block belongs to the third category at time t3 as shown in FIG. 23. That is, two memory blocks BLK whose number of erases is greater than or equal to N1 and less than N2 change from the second category to the first category.

Thereafter, suppose, as a result of the repetition of the W/E cycle, 5 memory blocks BLK belong to the first category, 20 memory blocks BLK belong to the second category, and 30 memory blocks BLK belong to the third category at time t4 as shown in FIG. 23. That is, as a result of an increase in the number of erases of the memory blocks BLK belonging to the second category, the number of memory blocks belonging to the second category has decreased too much (YES in step S45 in FIG. 22).

Then, the card controller 12 changes the threshold level between the second category and the third category (step S46 in FIG. 22). That is, as shown in FIG. 24, the card controller 12 changes the threshold level between the second category and the third category to N4 (>N3). As a result, 5 memory blocks belong to the first category, 50 memory blocks belong to the second category, and no memory block belongs to the third category as shown in FIG. 23. That is, 30 memory blocks BLK whose number of erases is greater than or equal to N3 and less than N4 change from the second category to the first category.

With the above method, the number of memory blocks BLK which have to hold system data, the number of memory blocks BLK which have to hold ordinary data, and the number of isolated blocks BLK are always kept at the optimum values, which prevents only any one of the memory blocks BLK from being consumed.

The third embodiment may be applied to the first and second modifications of the first embodiment. In FIGS. 13 and 14, the number of erases and status is written to the redundant page. In the third embodiment, page PG0 has been treated as a redundant page and the number of erases and status is written to the page PG0. However, as in the second embodiment, the page PG128 may be treated as a redundant page and the number of erases and state may be written to the page PG128 or another page. It is desirable that the number of erases and status should be written to the page PG0. The reason is that, in case of that the NAND flash memory writes the number of erases automatically, it has to wait for the controller to complete writing the data to pages PG0 to PG127 and therefore it is desirable that the number of erases and state should be written immediately after erase from the viewpoint of the reduction of the risk of losing information on the number of erases.

Fourth Embodiment

Figure 25:
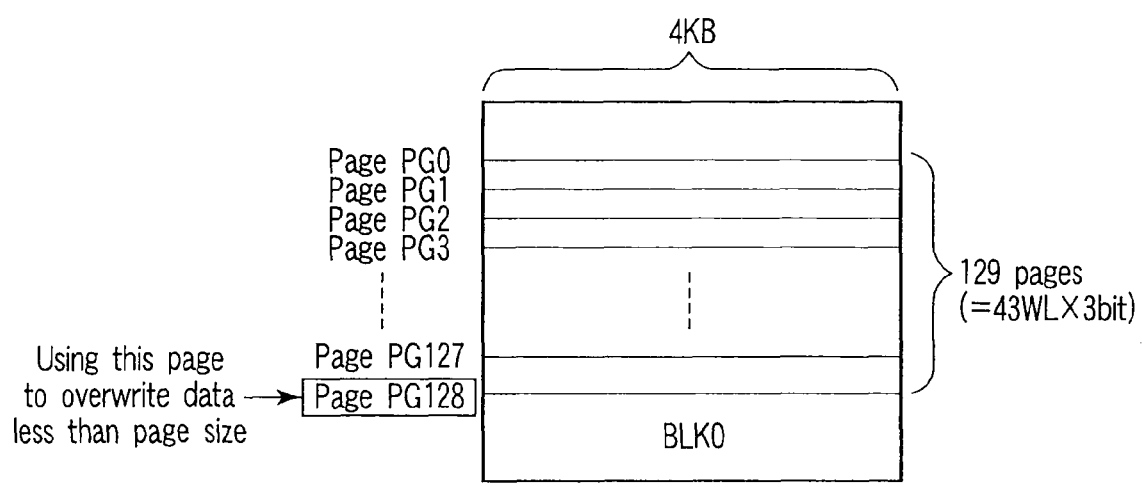
FIG. 25 is a block diagram of a memory block included in a flash memory according to a fourth embodiment of the invention.

Next, a semiconductor memory device and a memory system according to a fourth embodiment of the present invention will be explained. Like the second and third embodiments, the fourth embodiment is related to how to use a page not used in the first embodiment. In the fourth embodiment, the redundant page is used to hold data whose size is smaller than a page size. Since the configuration of the memory system and the configuration of the card controller 12 and NAND flash memory 11 are as shown in FIGS. 1 to 6 explained in the first embodiment, an explanation of them will be omitted. FIG. 25 is a block diagram of a memory block BLK included in an 8-level NAND flash memory 11 of the fourth embodiment, showing a memory block BLK in pages. Although only memory block BLK0 is shown in FIG. 25, the same holds true for the other memory blocks BLK1 to BLKm.

As shown in FIG. 25, since each memory cell transistor MT is capable of holding 3-bit data as in the first embodiment, each memory block BLK has (43 WL×3 bits)=129 pages. Of them, pages PG0 to PG127 are used as a user data region. That is, the size of the region the user can use is 512 Kbytes. Moreover, page PG128 not used in the first embodiment is used as a page for storing update data whose data size is smaller than a page size (4 Kbytes) and which is for data stored in any one of the pages PG0 to PG127 in the memory block BLK. Until the update data is written to the page PG128, the page 128 can be accessed from the card controller 12, but cannot be accessed from the host apparatus 2. Conversely, after it is written to, it can also be accessed from the host apparatus 2, but the page which holds update original data is inhibited from being accessed. Accordingly, before and after page PG128 is accessed, the size of the region the user can access is 512 Kbytes, which remains unchanged. This can be achieved by the card controller 12, which discards the logical address of the page holding the update original data and allocates a new logical address to page PG128.

Figure 26:
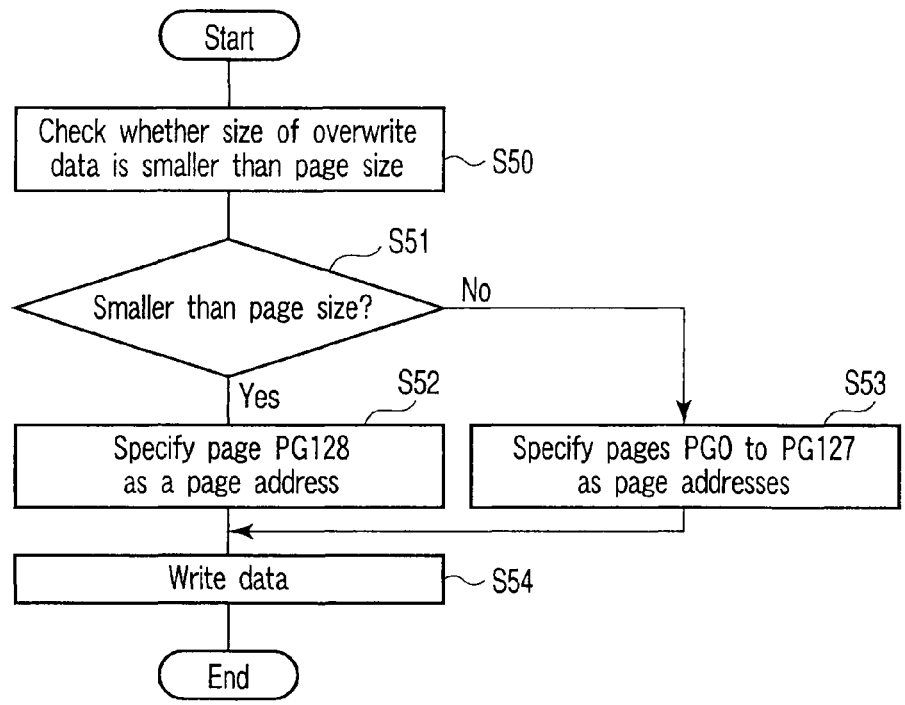
FIG. 26 is a flowchart to help explain a data writing method for a card controller according to the fourth embodiment.

Next, the operation of the card controller 12 in writing data will be explained using FIG. 26. FIG. 26 is a flowchart to help explain the operation of the card controller 12.

As shown in FIG. 26, the MPU 22 of the card controller 12 determines whether the data size of data to be overwritten to any one of the memory blocks BLK is smaller than the page size (4 Kbytes) (step S50). If the data size of the overwrite data is smaller than the page size (YES in step S51), the MPU 22 specifies page PG128 as a page address (step S52). If the data size of the overwrite data is the page size, the MPU 22 specifies any one of pages PG0 to PG127 as a page address (step S53). Then, the overwrite data is written to the page specified in step S52 or step S53 in the NAND flash memory 11 (step S54).

As in the second embodiment, in the fourth embodiment, the memory block BLK includes a first memory region and a second memory region. Then, the data held in the first region is updated, the MPU 22 writes the update data to the second memory region.

As described above, the NAND flash memory of the fourth embodiment produces not only the effect in Item (1) explained in the first embodiment but also the effect described in Item (6), below.

(6) The occurrence of a copying process is suppressed, which improves the writing speed of the NAND flash memory.

Figure 27:
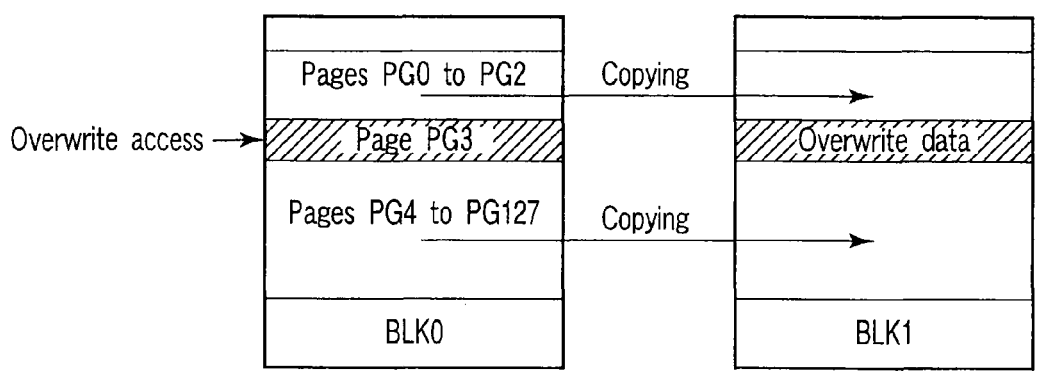
FIG. 27 is a block diagram of memory blocks included in the flash memory, showing a copy operation performed in updating data.

Generally, data cannot be overwritten in the NAND flash memory. The reason is that data is written to the memory cell transistors MT sequentially in the NAND flash memory, beginning with the one closest to the select gate line SGS. Accordingly, when data is updated in any one of the pages, even if it is a small amount of data less than the page size, a copying process is needed. This will be explained using FIG. 27. FIG. 27 is a block diagram of two memory blocks BLK0, BLK1.

As shown in FIG. 27, consider a case where the data in page PG3 is updated in, for example, memory block BLK0. In this case, since data cannot be overwritten in page PG3 of memory block BLK0, another erased memory block BLK1 is prepared. Then, the data in pages PG0 to PG2 of memory block BLK0 are copied to memory block BLK1. Next, update data is written to memory block BLK1. Finally, the data in pages PG4 to PG127 of memory block BLK0 are copied to memory block BLK1. As described above, even if data whose size is small is updated, the operation of copying a very large amount of data is needed, which causes the problem of making the write operation slower.

Figure 28:
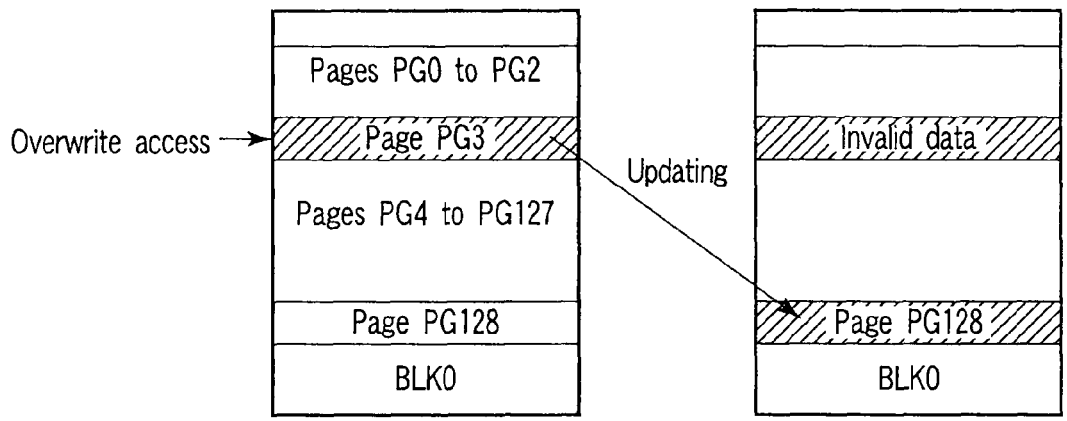
FIG. 28 is a block diagram of memory blocks included in the flash memory of the fourth embodiment, showing that a copy operation is not needed in updating data.

In the fourth embodiment, however, the copying process is not needed. This will be explained using FIG. 28. FIG. 28 is a block diagram of memory block BLK0.

As shown in FIG. 28, in memory block BLK0, page PG128 is prepared as a redundant page. When the data in page PG3 is updated, update data is written to page PG128. From this point on, the data in page PG3 becomes invalid data and is inhibited from externally being accessed.

As described above, a copying process is not needed, which makes the write operation of the NAND flash memory remarkably faster. While in the fourth embodiment, update data has been less than the page size, update data may be of the page size, provided that it is overwrite data. Of course, the fourth embodiment may be applied to the first and second modifications of the first embodiment. Moreover, of pages PG0 to PG128, the page serving as the redundant page is not necessarily limited to page PG128 and may be any one of pages PG0 to PG128.

Fifth Embodiment

Figure 29:
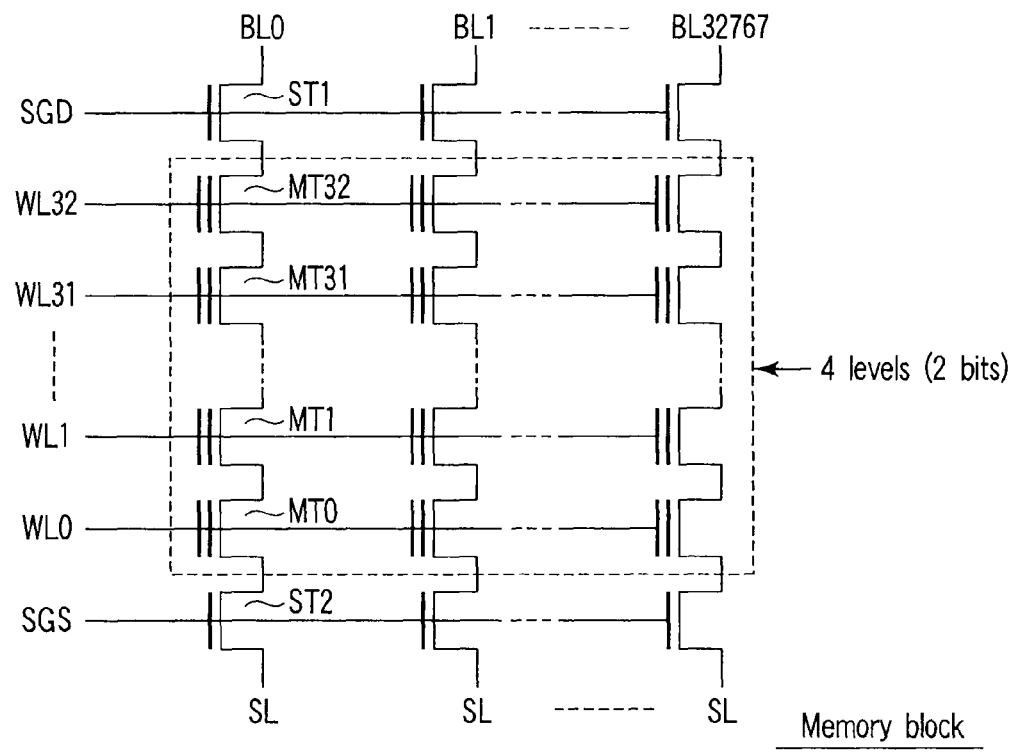
FIG. 29 is a circuit diagram of a flash memory according to a fifth embodiment of the invention.

Next, a semiconductor memory device and a memory system according to a fifth embodiment of the present invention will be explained. The fifth embodiment is such that the second to fourth embodiments are applied to a 4-level NAND flash memory. Since the configuration of each of the memory system, card controller 12, and NAND flash memory 11 is as shown in FIGS. 1 to 4 explained in the first embodiment, an explanation of them will be omitted. FIG. 29 is a circuit diagram of a memory block BLK included in a 4-level NAND flash memory 11 of the fifth embodiment.

As shown in FIG. 29, the memory block BLK of the fifth embodiment is such that, in the configuration of FIG. 5 explained in the first embodiment, the number of word lines WL is changed to 33 and the memory cell transistor MT is modified so as to hold 4-level data, that is, 2-bit data.

Figure 30:
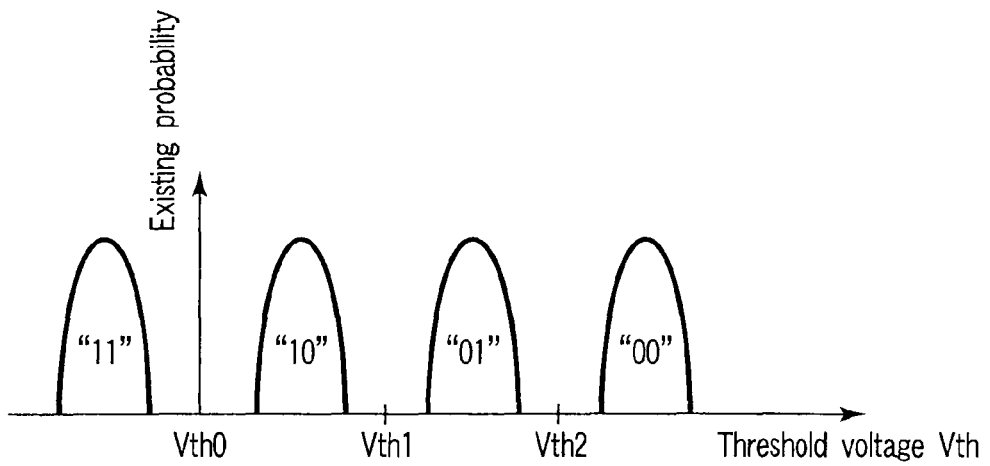
FIG. 30 is a graph showing the threshold value distribution of a memory cell transistor included in the flash memory according to the fifth embodiment.

FIG. 30 is a graph showing threshold voltages of the memory cell transistor MT, particularly showing a threshold voltage distribution in holding each item of data in the 4 levels. As shown in FIG. 30, the threshold voltage of the memory cell transistor MT rises in this order: "11," "10," "01," and "00." Of course, this is illustrative and not restrictive. The correspondence between the individual items of data and their threshold voltages can be set suitably.

Figure 31:
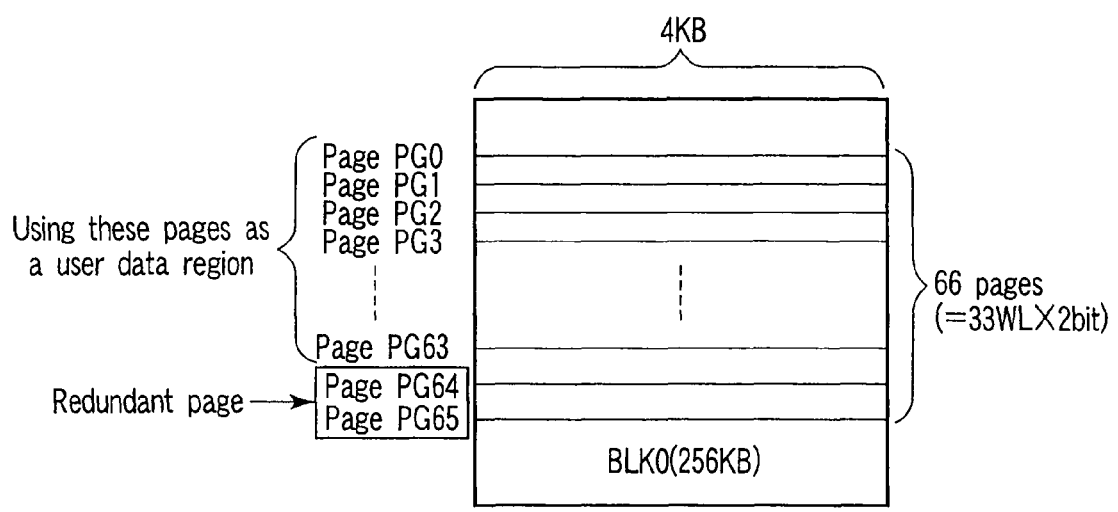
FIG. 31 is a block diagram of memory blocks included in the flash memory according to the fifth embodiment.

FIG. 31 is a block diagram of the memory block BLK, showing the memory block BLK in pages. Although only memory block BLK0 is shown in FIG. 31, the same holds true for the other memory blocks BLK1 to BLKm.

As shown in FIG. 31, since each memory cell transistor MT is capable of holding 2-bit data, each memory block BLK has (33 WL×2 bits)=66 pages. Of them, pages PG0 to PG63 are used as a user data region. Pages PG64, PG65 are used as redundant pages. Accordingly, the size of the region the user can use is 256 Kbytes, which can be expressed by a power-of-two value. The redundant pages PG64, PG65 are used as the redundant pages explained in the second to fourth embodiments. That is, the redundant pages PG64, PG65 are used to hold system management information, the number of erases and status, or update data.

In other words, the memory block BLK includes a first memory region including the pages PG0 to PG63 and a second memory region including the pages PG64, PG65. The first memory region is a memory space (256 Kbytes) formed by 2 bits held in each of the memory cell transistors MT connected to word lines WL0 to WL31. The second memory region is a memory space (8 Kbytes) formed by 2 bits held in each of the memory cell transistors MT connected to word line WL32. The MPU 22 treats pages PG64, 65 as redundant pages. Of course, the pages treated as redundant pages are not limited to pages PG64, PG65 and may be two of pages PG0 to PG65.

As described above, the second to fourth embodiments may be applied to not only an 8-level NAND flash memory but also a 4-level NAND flash memory. While in the fifth embodiment, a 4-level NAND flash memory has been explained, it may be applied to a NAND flash memory which holds $2^i$-bit data (i is a natural number), such as 2-level data or 16-level data.

As described above, with a memory system and a NAND flash memory according to each of the first to fifth embodiments, the data retention reliability can be improved. In a NAND flash memory of the first embodiment, the number of word lines is adjusted in an 8-level NAND flash memory and any one of the pages is inhibited from being used, thereby setting the capacity of the memory blocks BLK to a power-of-two value.

Specifically, the 8-level NAND flash memory of the first embodiment includes a plurality of memory cell transistors MT each of which has a stacked gate including a charge accumulation layer and a control gate, a plurality of memory blocks BLK in each of which the memory cell transistors MT are arranged in a matrix, and word lines WL0 to WL42 which are connected to the control gates of the memory cell transistors MT in the same row in a common connection manner in the memory blocks BLK. The data in the memory cell transistors MT in the memory block BLK are erased simultaneously, which makes the memory block BLK an erase unit of the data. Moreover, any one of the memory cell transistors MT is capable of holding 3-bit data. The data size the memory cell transistors MT included in the memory block BLK can hold is 512 Kbytes.

While in the first embodiment, an 8-level NAND flash memory has been explained, the embodiment is not limited to this. The embodiment may be applied to another type of NAND flash memory, provided that each memory cell transistor MT holds M bits of data ($M \neq 2^i$, where i is a natural number and M is a natural number greater than or equal to 3) and the size of a memory block is L bits ($L=2^k$, where k is a natural number).

In the second to fourth embodiments, a redundant page is provided by adjusting the number of word lines. The redundant page is used to hold system management information, the number of erases, or page update data.

Specifically, the memory system according to the second and third embodiments is a memory system which includes a semiconductor memory device (an 8-level NAND flash memory 11) capable of holding data and a memory controller 12 which receives first data from the outside and writes the first data to the semiconductor memory device. The 8-level NAND flash memory 11 includes a plurality of memory cell transistors MT each of which has a stacked gate including a charge accumulation layer and a control gate and is capable of holding 3-bit data, a plurality of memory blocks BLK in each of which the memory cell transistors MT are arranged in a matrix, and word lines WL0 to WL42 which are connected to the control gates of the memory cell transistors MT in the same row in a common connection manner in the memory blocks BLK. The memory controller 12 includes an interface 21 which receives the first data from the outside and a processor (MPU22) which writes the first data to the 8-level NAND flash memory 11 and generates second data, information on the memory blocks BLK, and writes the second data to the semiconductor memory device. The data in the memory cell transistors MT included in the memory block BLK are erased simultaneously, which makes the memory block BLK an erase unit of the data. Moreover, the word lines WL0 to WL42 include first word lines WL0 to WL41 and a second word line WL42. The memory block BLK includes a first memory region (pages PG0 to PG127) and a second memory region (page PG128). The first memory region (pages PG0 to PG127) is a memory space which is formed by the 3 bits in each of the memory cell transistors MT connected to the first word lines WL0 to WL41 and two (j=2<3) of the 3 bits in each of the memory cell transistors MT connected to the second word line WL42 and which can hold 512 Kbytes ($=2^i$, where i is a natural number) of data in the total size. The second memory region (page PG128) is a memory space formed by 1 (=3−2) bit in each of the memory cell transistors MT connected to the second word line WL128. The MPU22 writes the first data to the first memory region (pages PG0 to PG127) and the second data to the second memory region (page PG128).

Furthermore, in the fourth embodiment, when receiving update data for data held in the first memory region (pages PG0 to PG127) from the outside, the MPU 22 writes the update data to the second memory region (page PG128) in the configuration of each of the second and third embodiments.

As explained in the fifth embodiment, in the case of the 4-level NAND flash memory 11, the first memory region (pages PG0 to PG63) is a memory space which is formed by the 2 bits in each of the memory cell transistors MT connected to the first word lines WL0 to WL31 and which can hold 256 Kbytes ($=2^i$, where i is a natural number) of data in the total size. The second memory region (pages PG64, PG65) is a memory space formed by the 2 bits in each of the memory cell transistor MT connected to the second word line WL32.

When there is a plurality of redundant pages, the second to fourth embodiments may be combined. Specifically, system management information may be stored in a redundant page, the number of erases in another redundant page, and update data in still another redundant page.

Furthermore, the number of word lines, the number of bits, and the number of bits each memory cell transistor MT can hold are not limited to those explained in the above embodiments and may be selected suitably. Moreover, while in the above embodiments, the explanation has been given using a memory card as an example, the embodiments are, of course, not restricted to a memory card.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. An operating method for a memory system including a semiconductor memory device which has a plurality of memory cell transistors each of which is capable of holding M bits (M is a natural number greater than or equal to 2) of data, first and second word lines which connect gates of the memory cell transistors, and a plurality of memory blocks each of which includes the memory cell transistors and is an erase unit of the data, and each of which includes a first memory region and a second memory region, the first memory region being a memory space which is formed by the M bits in each of the memory cell transistors connected to the first word lines or the M bits in each of the memory cell transistors connected to the first word lines and j bits (j is a natural number satisfying j<M) of the M bits in each of the memory cell transistors connected to the second word lines and which is capable of holding L bits ($=2^k$, where k is a natural number) in a data size, and the second memory region being a memory space formed by the M bits or (M−j) bits in each of the memory cell transistors connected to the second word lines, the method comprising:

receiving first data from a host apparatus;

writing the first data to the first memory region of the semiconductor memory device;

generating second data which is information on the memory blocks; and writing the second data to the second memory region of the semiconductor memory device.

2. The method according to claim 1, wherein the second memory region is inhibited from being accessed from the host apparatus.

3. The method according to claim 1, wherein the second data is system management information on the memory blocks.

4. The method according to claim 1, wherein the second data is the number of times data in the memory blocks was erased.

5. The method according to claim 4, further comprising:
erasing data in one of the memory blocks;
reading the number of times from the second memory region in the one of the memory blocks to be erased; and
after the erasing, updating the number of times held in the second memory region.

6. The method according to claim 5, further comprising:
accessing the second memory region in the one of the memory blocks to be erased, when erasing the data; and
resetting the number of times when all of the memory cell transistors in the second memory region are in an erased state.

7. The method according to claim 4, wherein an operating condition for a write operation or a read operation is set according to the number of times held in the second memory region.

8. The method according to claim 7, wherein the operating condition for a write operation is the magnitude of a program voltage applied to the first word lines, and
the operating condition for the read operation is a threshold level in determining readout data.

9. The method according to claim 4, further comprising:
controlling the frequency of use of the memory blocks according to the number of times held in the second memory region.

10. The method according to claim 9, further comprising:
determining whether to use the memory blocks by comparing the number of times held in the second memory region with a determined threshold value; and
varying the threshold value according to the distribution of the number of times for each of the memory blocks.

11. An operating method for a memory system including a semiconductor memory device which has a plurality of memory cell transistors capable of holding M bits (M is a natural number greater than or equal to 2) of data, first and second word lines which connect gates of the memory cell transistors, and a plurality of memory blocks each of which includes the memory cell transistors and is an erase unit of the data, and each of which includes a first memory region and a second memory region, the first memory region being a memory space which is formed by the M bits in each of the memory cell transistors connected to the first word lines or the M bits in each of the memory cell transistors connected to the first word lines and j bits (j is a natural number satisfying j<M) of the M bits in each of the memory cell transistors connected to the second word lines and which is capable of holding L bits ($=2^k$, where k is a natural number) in a data size, and the second memory region being a memory space formed by the M bits or (M−j) bits in each of the memory cell transistors connected to the second word lines, the method comprising:
receiving data from a host apparatus;
writing the data to the first memory region;
receiving update data for the data held in the first memory region; and
writing the update data to the second memory region.

12. The method according to claim 11, wherein the memory cell transistors in the second memory region are inhibited from being accessed from the host apparatus in an erased state and, after the update data has been written, are allowed to be accessed.

13. The method according to claim 12, further comprising:
inhibiting the memory cell transistor holding data before update from being accessed in the first memory region, after writing the update data to the second memory region.

* * * * *